United States Patent
Hara

(10) Patent No.: US 12,088,170 B2
(45) Date of Patent: Sep. 10, 2024

(54) ELECTRIC DRIVE DEVICE AND ELECTRIC POWER STEERING DEVICE WITH AIR CIRCULATION PASSAGE

(71) Applicant: HITACHI ASTEMO, LTD., Hitachinaka (JP)

(72) Inventor: Hideyuki Hara, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 490 days.

(21) Appl. No.: 17/426,789

(22) PCT Filed: Feb. 13, 2020

(86) PCT No.: PCT/JP2020/005468
§ 371 (c)(1),
(2) Date: Jul. 29, 2021

(87) PCT Pub. No.: WO2020/166649
PCT Pub. Date: Aug. 20, 2020

(65) Prior Publication Data
US 2022/0416614 A1   Dec. 29, 2022

(30) Foreign Application Priority Data
Feb. 13, 2019   (JP) ................................ 2019-023464

(51) Int. Cl.
*H02K 5/10* (2006.01)
*B62D 5/04* (2006.01)
(Continued)

(52) U.S. Cl.
CPC ........... *H02K 5/207* (2021.01); *B62D 5/0406* (2013.01); *B62D 5/0463* (2013.01); *H02K 5/10* (2013.01);
(Continued)

(58) Field of Classification Search
CPC ............ H02K 5/10; H02K 5/20; H02K 5/207; H02K 9/02; H02K 9/04; H02K 9/06;
(Continued)

(56) References Cited

U.S. PATENT DOCUMENTS

2007/0046112 A1 *  3/2007  Uehara .................. H02K 11/05
                                                                310/58
2009/0284106 A1 * 11/2009  Utsumi .................. H02K 5/207
                                                                310/68 R
(Continued)

FOREIGN PATENT DOCUMENTS

JP    2009124829 A  *  6/2009  ............. B61C 17/00
JP    2016-119799 A     6/2016
(Continued)

OTHER PUBLICATIONS

Machine Translation of KR100912524, Aug. 2009 (Year: 2009).*
(Continued)

*Primary Examiner* — Eric Johnson
(74) *Attorney, Agent, or Firm* — FOLEY & LARDNER LLP

(57) ABSTRACT

Air circulation passages connect an accommodation space of an electronic control unit to the outside to circulate air to buffer internal pressure fluctuations. The accommodation space side of the air circulation passages is formed as a divided air circulation passage with a plurality of passages, a cooling object member is arranged to come in thermal contact with air flowing through the divided air circulation passage, and the total cross-sectional area of the divided air circulation passage is smaller than the cross-sectional area of the air circulation passages that are not divided. Because the accommodation space of the electronic control unit is connected to the outside, internal pressure fluctuations can be buffered, and increasing the flow velocity of the air flowing through the divided air circulation passage on the accom- (Continued)

modation space side of the air circulation passages allows heat inside the accommodation space to be efficiently radiated to the outside.

13 Claims, 16 Drawing Sheets

(51) Int. Cl.
 H02K 5/20 (2006.01)
 H02K 11/33 (2016.01)
(52) U.S. Cl.
 CPC ......... *H02K 11/33* (2016.01); *H02K 2205/09* (2013.01); *H02K 2211/03* (2013.01)
(58) Field of Classification Search
 CPC .......... H02K 9/22; H02K 9/223; H02K 9/227; H02K 11/30; H02K 11/33; H02K 2205/09; B62D 5/0406; B62D 5/0463; H05K 7/20909
 See application file for complete search history.

(56) References Cited

U.S. PATENT DOCUMENTS

| | | | |
|---|---|---|---|
| 2010/0181877 A1 | 7/2010 | Watanabe et al. | |
| 2013/0334915 A1* | 12/2013 | Walme | H02K 5/18 310/64 |
| 2015/0236570 A1* | 8/2015 | Hayashi | H02K 11/30 310/71 |
| 2016/0037674 A1* | 2/2016 | Yamanaka | H05K 7/205 361/709 |
| 2016/0181885 A1* | 6/2016 | Yamasaki | H02K 5/225 180/443 |
| 2017/0301662 A1 | 10/2017 | Kimura et al. | |
| 2017/0353082 A1* | 12/2017 | Hamada | H02K 11/33 |
| 2018/0283524 A1* | 10/2018 | Uematsu | H02K 5/10 |
| 2019/0199175 A1 | 6/2019 | Kanazawa et al. | |
| 2019/0393760 A1 | 12/2019 | Morishita et al. | |
| 2020/0195098 A1* | 6/2020 | Shimakawa | H02K 5/10 |

FOREIGN PATENT DOCUMENTS

| | | |
|---|---|---|
| JP | 2017-195687 A | 10/2017 |
| JP | 2018-038218 A | 3/2018 |
| JP | 2018-046745 A | 3/2018 |
| JP | 2018-148718 A | 9/2018 |
| KR | 100912524 B1 * | 8/2009 |
| WO | WO-2009/060810 A1 | 5/2009 |

OTHER PUBLICATIONS

Koyama, Machine Translation of JP2009124829, Apr. 2009 (Year: 2009).*
International Preliminary Report on Patentability dated Aug. 26, 2021 issued in International Application No. PCT/JP2020/005468, with English translation, 21 pages.
International Search Report dated May 12, 2020 issued in International Application No. PCT/JP2020/005468, with English translation, 5 pages.

* cited by examiner

ELECTRIC DRIVE DEVICE AND ELECTRIC POWER STEERING DEVICE WITH AIR CIRCULATION PASSAGE

TECHNICAL FIELD

The present invention relates to an electric drive device and an electric power steering device, and particularly to an electric drive device and an electric power steering device incorporating an electronic control device.

BACKGROUND TECHNOLOGY

In a general industrial machine field, although a mechanical system control element is driven by an electric motor, recently, a so-called mechanically and electrically-integrated electric drive device in which an electronic control unit composed of a semiconductor element for controlling the rotation speed and the rotation torque of an electric motor is integrally incorporated in the electric motor has been adopted.

As an example of the mechanically and electrically-integrated electric drive device, for example, in an electric power steering device of a vehicle, the rotation direction and the rotation torque of a steering shaft which is rotated by the operation of a steering wheel by a driver are detected, and, based on the detected values, an electric motor is driven so as to rotate in the same direction as the rotation direction of the steering shaft, to generate steering assist torque. In order to control the electric motor, an electronic control unit (ECU: Electronic Control Unit) is provided to the power steering device.

As a conventional electric power steering device, for example, one described in a patent document 1 has been known. This electric power steering device is composed of an electric motor section and an electronic control unit. An electric motor of the electric motor section is accommodated in a cylindrical motor housing made of, for example, aluminum alloy, and a board mounting electronic components of the electronic control unit is accommodated in an ECU housing disposed on the side opposite of the output shaft in the axial direction of the motor housing. The board accommodated in the ECU housing is provided with a power source circuit part, a power conversion circuit part having a power switching element, such as MOSFET or IGBT, for driving and controlling the electric motor, and a control circuit part for controlling the power switching element, and the output terminal of the power switching element is electrically connected with the input terminal of the electric motor via a bus bar.

In addition, other than this, as an electric drive device in which an electronic control device is integrated, for example, an electric hydraulic control apparatus for an electric brake and each hydraulic control has been know. However, in the following explanation, as a representative, an electric power steering device will be explained.

PRIOR ART REFERENCE

Patent Document

Patent Document 1: Japanese Patent Application Publication 2016-119799

SUMMARY OF THE INVENTION

Problem(s) to be Solved by the Invention

In the electric power steering device having such a configuration of the patent document 1, an adhesive is provided between a connector case and a heat sink member, and an O-ring is provided between the heat sink member and a motor housing member to form a waterproof structure, in order to suppress the penetration of water from the outside. However, in an accommodation space of the electronic control unit, internal pressure fluctuations in which internal pressure fluctuates due to the effect of the heat generation of the electronic control unit itself easily occur.

Consequently, when the pressure of the accommodation space becomes higher than that of the outside due to temperature fluctuations, there is possibility that the adhesive or the O-ring is peeled off from a sealing surface, and a waterproof function is lost. In addition, when the pressure of the accommodation space becomes lower than that of the outside, it is expected that water penetrates from the gap of the adhesive or the O-ring, and there is possibility that an electric component of the electronic control unit is damaged caused by the water penetration. The buffering of the internal pressure fluctuations of the accommodation space is therefore required.

In addition, in this type of the electronic control unit, a switching element such as MOSFET for controlling and driving an electric motor is used, and its heating value is large. Although the heat generated in the switching element is radiated to the outside by, for example, a heat sink, the heat radiation by the heat sink is limited due to a requirement for a reduction in the size of the power steering device. Therefore, an improvement in heat radiation performance is further required.

Accordingly, in this type of the electric drive device and the electric power steering device, it is expected to solve the above problem, and the present invention is one to meet such a requirement.

An object of the present invention is to provide an electric drive device and an electric power steering device which are capable of suppressing the internal pressure fluctuations of the accommodation space of the electronic control unit, and of efficiently radiating, to the outside, the heat generated in the electronic control unit.

Means for Solving the Problem(s)

In a feature of the present invention, an air circulation passage connecting an accommodation space of an electronic control unit to the outside so as to circulate air to buffer internal pressure fluctuations is provided, the accommodation space side of the air circulation passage is formed as a divided air circulation passage divided into a plurality of passages, a cooling object member is arranged so as to come in thermal contact with the air flowing through the divided air circulation passage, and the total cross-sectional area of the divided air circulation passage is made smaller than the cross-sectional area of the air circulation passage which has not been divided.

Effect of the Present Invention

According to the present invention, since by the air circulation passage, the accommodation space of the electronic control unit is connected to the outside, internal pressure fluctuations can be buffered, and, moreover, by increasing the flow velocity of the air flowing through the divided air circulation passage of the accommodation space side of the air circulation passage, the heat of the cooling object member can be efficiently radiated to the outside.

MODE FOR IMPLEMENTING THE INVENTION

In the following, although embodiments of the present invention will be explained in detail by using drawings, the present invention is not limited to the following embodiments, and various variations and applications are included in a scope of a technical concept of the present invention.

Figure 1:
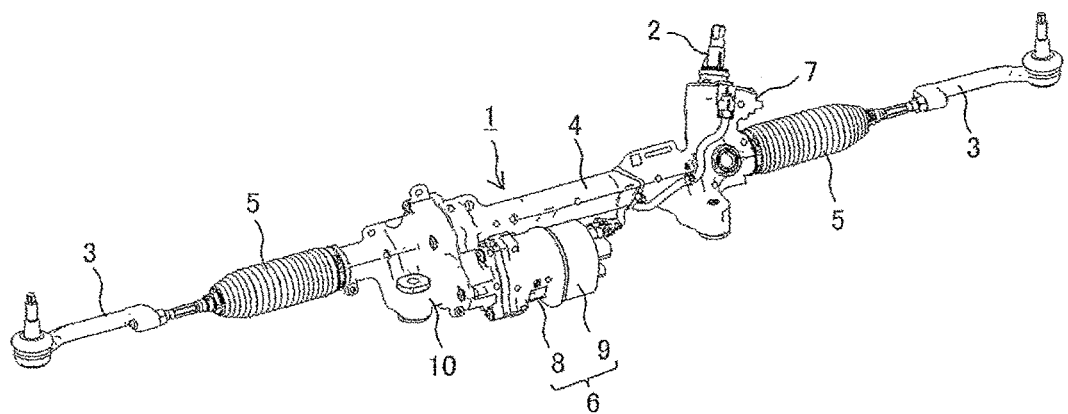
FIG. 1 is a perspective view of a whole steering apparatus as an example, to which the present invention is applied.

Before explaining an embodiment of the present invention, as an example to which the present invention is applied, the configuration of a steering apparatus will be simply explained by using FIG. 1.

First, a steering apparatus for steering front wheels of a vehicle will be explained. A steering apparatus 1 is configured as shown in FIG. 1. A pinion which is not shown in the drawings is provided to the lower end of a steering shaft 2 connected to a steering wheel which is not shown in the drawings. This pinion meshes with a long rack extending in the right and left directions of a vehicle body which is not shown in the drawings. Tie rods 3 for steering the front wheels in the right and left directions are connected to the respective both ends of the rack, and the rack is covered with a rack housing 4. In addition, rubber boots 5 are provided between the rack housing 4 and the tie rods 3.

An electric power steering device 6 is provided for assisting torque at the time when the turning operation of the steering wheel is performed. That is, a torque sensor 7 for detecting the rotation direction and the rotation torque of the steering shaft 2 is provided, and there are provided an electric motor section 8 for applying steering auxiliary force to the rack via a gear 10 based on the detected values of the torque sensor 7 and an electronic control unit (ECU) 9 for controlling an electric motor disposed to the electric motor section 8.

Three positions in the outer periphery on the output shaft side of the electric motor section 8 of the electric power steering device 6 are connected to the gear 10 via bolts which are not shown in the drawings, and the electronic control unit 9 is provided on the opposite side of the output shaft of the electric motor section 8.

In the electric power steering device 6, when the steering shaft 2 is operated and rotated in either direction by the operation of the steering wheel, the rotation direction and the rotation torque of the steering shaft 2 are detected by the torque sensor 7, and based on the detected values, a control circuit part calculates the driving operation quantity of the electric motor.

The electric motor is driven by a power switching element of a power conversion circuit part based on the calculated driving operation quantity, and the output shaft of the electric motor drives the steering shaft 1 so as to be rotated in the same direction as the operation direction. The rotation of the output shaft is transmitted from the pinion not shown in the drawings to the rack not shown in the drawings via the gear 10, and the vehicle is steered. Such a configuration and action have already been known well, and further explanation is therefore omitted.

As mentioned above, in an accommodation space of the electronic control unit 9, internal pressure fluctuations occur due to the effect of the heat generation of the electronic control unit 9 itself. Consequently, when the pressure of the accommodation space becomes higher than that of the outside due to temperature fluctuations, there is possibility that an adhesive or an O-ring is peeled off from a sealing surface, and a waterproof function is lost. In addition, when the pressure of the accommodation space becomes lower than that of the outside, it is expected that water penetrates from the gap of the adhesive or the O-ring, and there is possibility that an electric component of the electronic control unit is damaged caused by the water penetration. The buffering of the internal pressure fluctuations of the accommodation space is therefore required.

In addition, in this type of the electronic control unit 9, a switching element such as MOSFET for controlling and driving an electric motor is used, and its heating value is large. Although the heat generated in the switching element is radiated to the outside by, for example, a heat sink, the heat radiation by the heat sink is limited due to a requirement for a reduction in the size of the power steering device. Therefore, an improvement in heat radiation performance is further required.

First Embodiment

Against such a background, in a first embodiment of the present invention, an electric power steering device having the following configuration is proposed.

That is, in the present embodiment, an air circulation passage connecting an accommodation space of an electronic control unit to the outside so as to circulate air to buffer internal pressure fluctuations is provided, the accommodation space side of the air circulation passage is formed as a divided air circulation passage divided into a plurality of passages, a cooling object member is arranged so as to come in thermal contact with the air flowing through the divided air circulation passage, and the total cross-sectional area of the divided air circulation passage is made smaller than the cross-sectional area of the air circulation passage which has not been divided.

Here, in the embodiments mentioned below, a cooling object member is an electronic component generating heat which is used in a power conversion circuit part and a control circuit part. In addition, it is a heat transfer functional member receiving the effect of the heat generated in the electronic component.

According to this configuration, since by the air circulation passage, the accommodation space of the electronic control unit is connected to the outside, internal pressure fluctuations can be buffered, and, moreover, by increasing the flow velocity of the air flowing through the divided air circulation passage of the accommodation space side of the air circulation passage, the heat of the cooling object member can be efficiently radiated to the outside.

In the following, a specific configuration of an electric power steering device according to the first embodiment of the present invention will be explained in detail while using FIG. 2 to FIG. 11.

Figure 2:
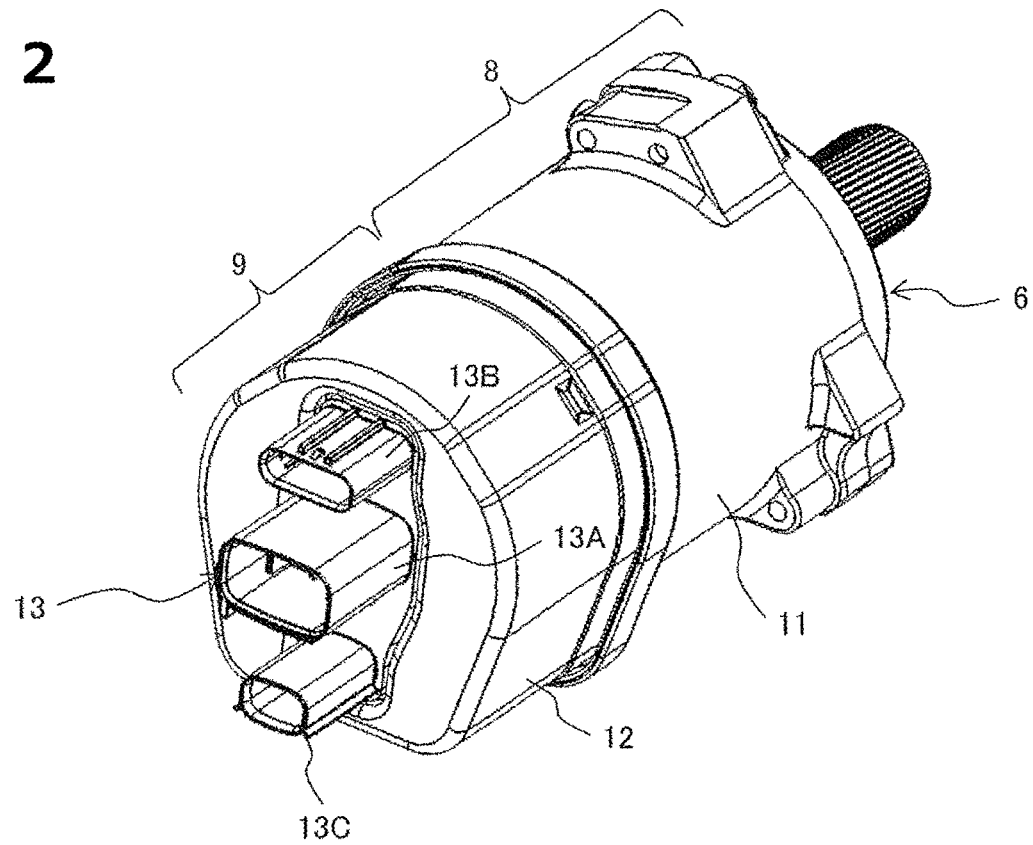
FIG. 2 is a perspective view of a whole electric power steering device which is a first embodiment of the present invention.
Figure 3:
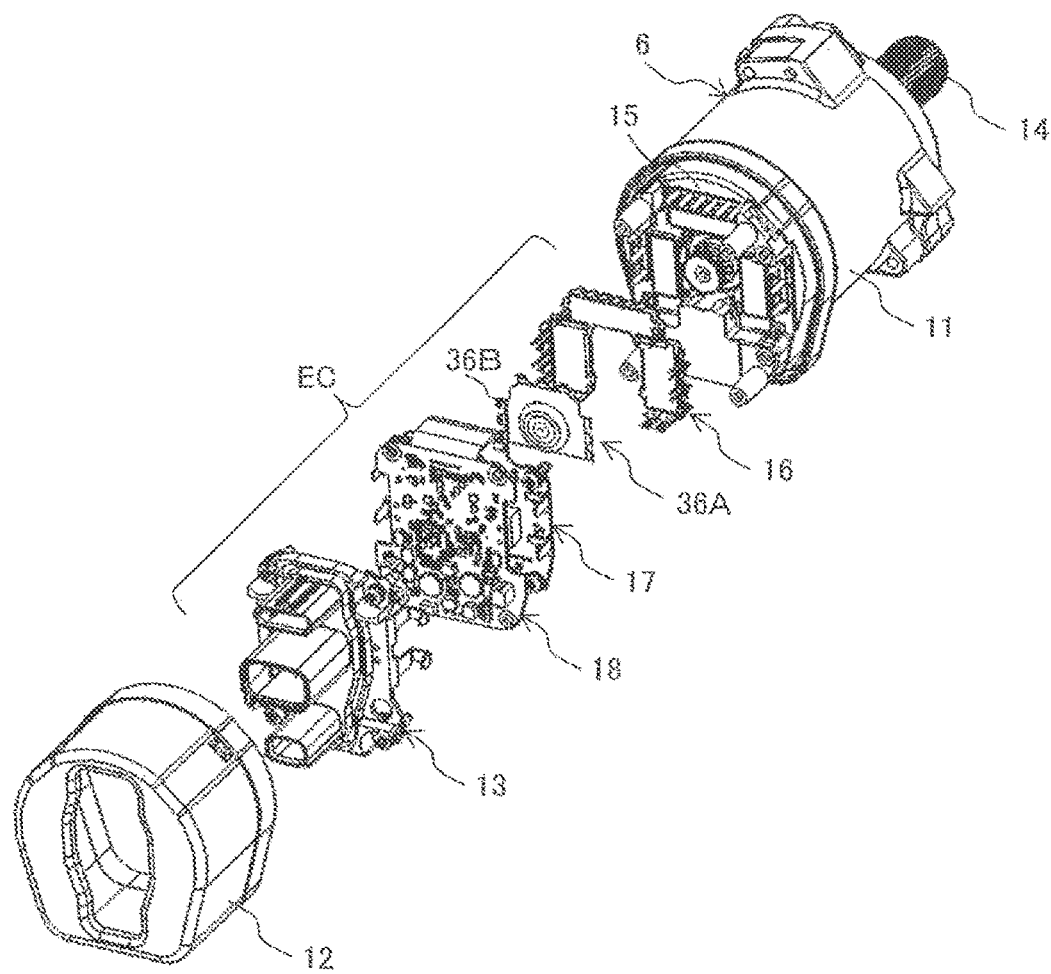
FIG. 3 is a perspective exploded view of the electric power steering device shown in FIG. 2.
Figure 10:
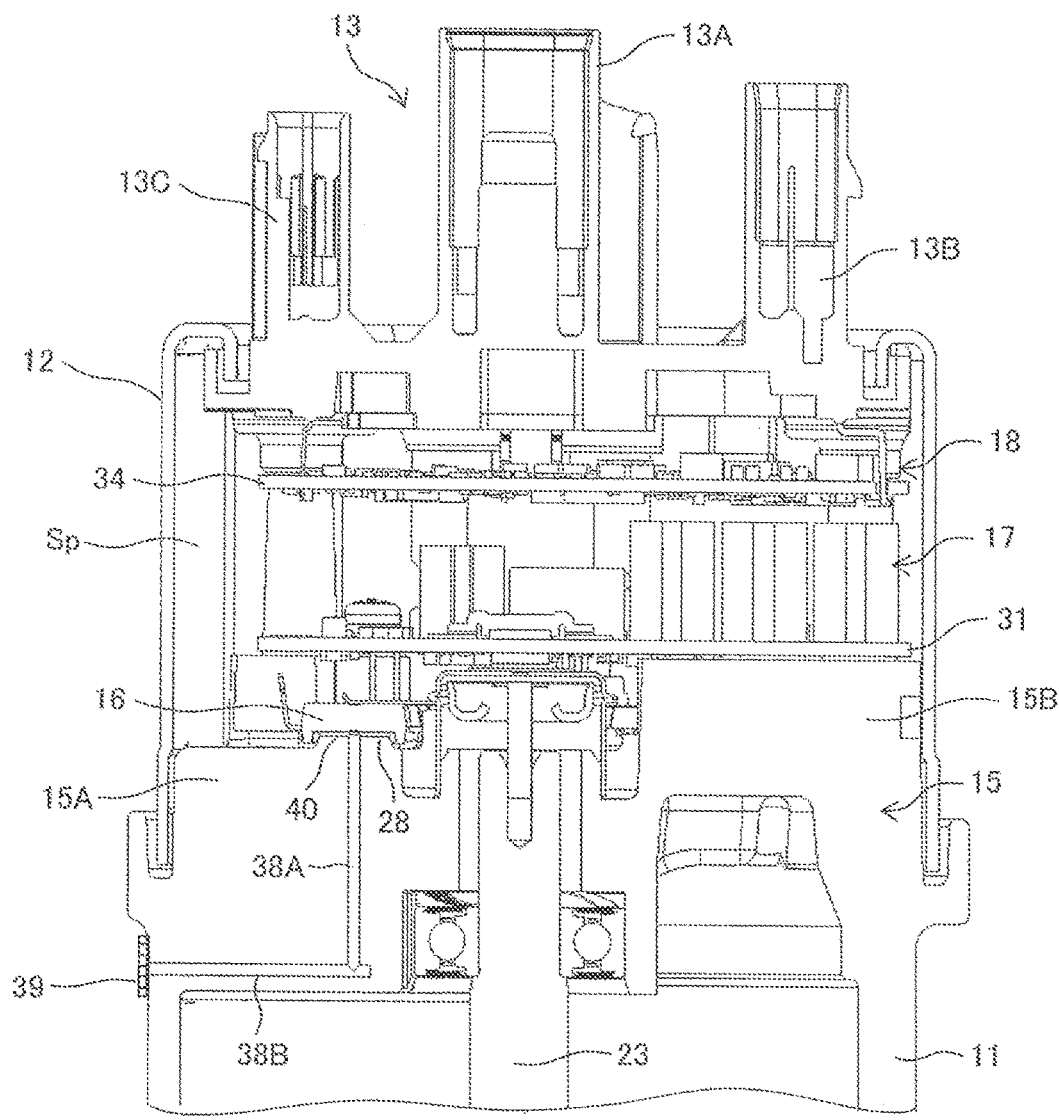
FIG. 10 is a sectional view for explaining a main part of the electric power steering device in the first embodiment of the present invention.
Figure 11:
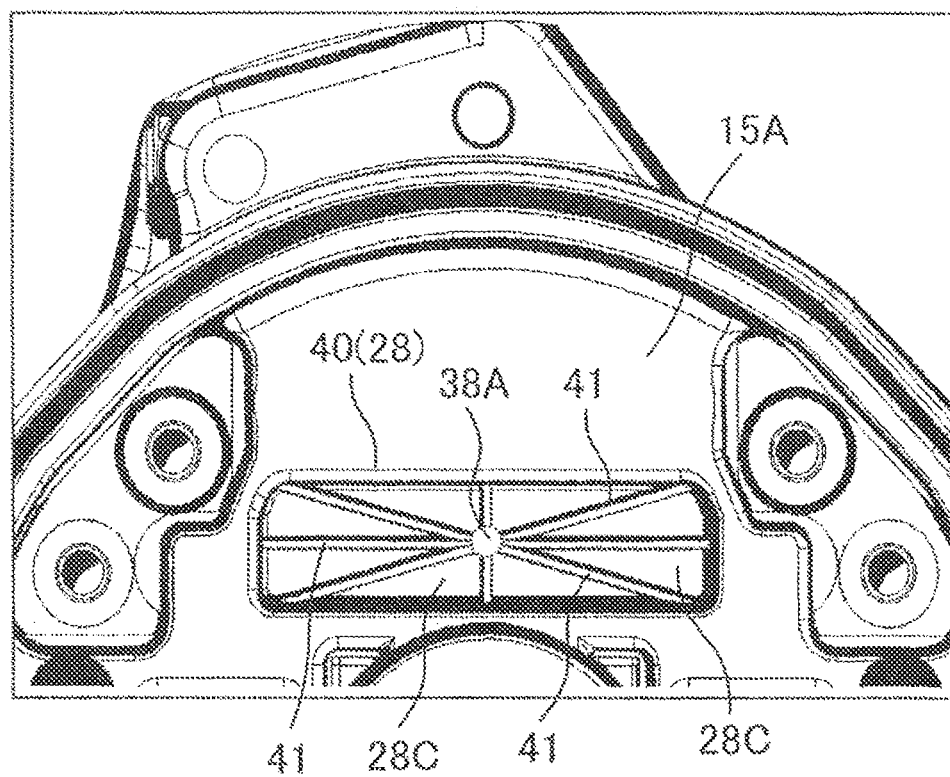
FIG. 11 is a top view when viewing, from the upper side, a divided air circulation passage formed to the end surface portion of the motor housing shown in FIG. 10.

Here, FIG. 2 is a drawing which shows a whole configuration of the electric power steering device according to the present embodiment. FIG. 3 is a drawing in which components of the electric power steering device shown in FIG. 2 are disassembled and then viewed in an oblique direction. FIG. 4 to FIG. 9 are drawings showing states in which each of the components is assembled according to the assembling order of the components. FIG. 10 is a drawing showing the cross section of a main part of the electric power steering device according to the present embodiment. FIG. 11 is a drawing to explain a divided air circulation passage. Therefore, in the following explanation, the configuration will be explained with reference to the drawings appropriately.

In addition, in FIG. 4 to FIG. 9, although the configurations of electronic components and the electric components of a control circuit part and a power source circuit part are slightly different from those shown in FIG. 3, functions are the same.

As shown in FIG. 2, an electric motor section 8 constituting the electric power steering device is composed of a motor housing 11 having a cylindrical part and made of, for example, aluminum alloy, and of an electric motor which is not shown in the drawings and which is accommodated in the motor housing 11. An electronic control unit 9 is composed of a metal cover 12 which is disposed on the opposite side of the output shaft in the axial direction of the motor housing 11 and which is made of, for example, aluminum alloy, and of an electronic control part which is not shown in FIG. 2 and which is accommodated in the metal cover 12.

The motor housing 11 and the metal cover 12 are integrally fixed to each other at their facing end surfaces by an adhesive, welding or a fixing bolt. The motor housing 11 forms an accommodation space for accommodating the electric motor. In addition, the metal cover 12 forms an accommodation space for accommodating thereinside the electronic control part, and the electronic control part accommodated in the accommodation space is composed of a power source circuit part for generating a required power source, a power conversion circuit having a power switching element for driving and controlling the electric motor in the electric motor section 8 which is formed by, for example, MOSFET or IGBT, and a control circuit part for controlling the power switching element. The output terminal of the power switching element is electrically connected to a coil input terminal of the electric motor via a bus bar.

A connector terminal assembly 13 is fixed to the end surface of the metal cover 12 by a fixing bolt. The connecter terminal assembly 13 is equipped with a connector terminal forming portion 13A for power supply, a connector terminal forming portion 13B for a detection sensor, and a control-state-sending connector terminal forming portion 13C for sending a control state to an external device.

Then, the electronic control unit accommodated in the metal cover 12 is supplied with power from a power source via the connector terminal forming portion 13A for power supply which is made of synthetic resin. In addition, the electronic control unit is supplied with detected signals of a driving condition and the like from various detection sensors via the detection-sensor connector terminal forming portion 13B, and a signal of the present control state of the electric power steering device is sent via the connector terminal forming portion 13C for sending a control state.

FIG. 3 shows a perspective exploded view of the electric power steering device 6. An annular side yoke (now shown in the drawings) made of iron is fitted to the inside of the motor housing 11, and the electric motor (not shown in the drawings) is accommodated in the side yoke. An output portion 14 of the electric motor applies steering assist force to a rack via a gear. In addition, the specific configuration of the electric motor has been known well, and its explanation is therefore omitted.

The motor housing 11 is made of aluminum alloy, and functions as a heat sink member for radiating, to the external atmosphere, the heat generated at the electric motor and the heat generated at the after-mentioned power source circuit part and power conversion circuit part. The electric motor section 8 is composed of the electric motor and the motor housing 11.

The electronic control unit 9 (EC) is attached to an end surface portion 15 of the motor housing 11 which is positioned on the opposite side of the output portion 14 of the electric motor section 8, so as to be adjacent thereto. The electronic control unit 9 is composed of a power conversion circuit part 16, a power source circuit part 17 and a control circuit part 18. Although the end surface portion 15 of the motor housing 11 is formed integrally with the motor housing 11, in addition to this, the end surface portion 15 may be separately formed, and then is integrated with the motor housing 11 by a bolt or by welding.

Here, the power conversion circuit part 16, the power source circuit part 17 and the control circuit part 18 constitute redundancy systems, and each constitute a double system of a main electronic control part and an auxiliary electronic control part. Normally, the electric motor is controlled and driven by the main electronic control part. However, when abnormalities or failures occur to the main electronic control part, it is switched to the auxiliary electronic control part, and the electric motor is controlled and driven.

Therefore, as mentioned below, normally, when the heat from the main electronic control part is transferred to the motor housing 11, and abnormalities or failures occur to the main electronic control part, the main electronic control part is stopped, the auxiliary electronic control part is operated, and then the heat from the auxiliary electronic control part is transferred to the motor housing 11.

In addition, different from the redundant system, the main electronic control part and the auxiliary electronic control part can be united so as to function as a normal electronic control part, such that when abnormalities or failures occur to one of the electronic control parts, the electric motor can be controlled and driven by the other of the electronic control parts by a half capacity. In this case, although the capacity of the electronic motor becomes half, a power steering function is ensured. Therefore, in a normal case, the heat from the main electronic control part and the heat from the auxiliary electronic control part are transferred to the motor housing 11.

The electronic control unit 9 (EC) is composed of the control circuit part 18, the power source circuit part 17, the power conversion circuit part 16, and the connector terminal assembly 13, and the power conversion circuit part 16, the power source circuit part 17, the control circuit part 18 and the connector terminal assembly 13 are arranged in this order in a direction away from the end surface portion 15 side of the motor housing 11. The control circuit part 18 is one for generating a control signal for driving a switching element of the power conversion circuit part 16, and is composed of a microcomputer, a peripheral circuit and the like.

The power source circuit part 17 is one for generating the power source for driving the control circuit part 18 and the power source for the power conversion circuit part 16, and is composed of a capacitor, a coil, a switching element and the like. The power conversion circuit part 16 is one for adjusting power which flows the coil of the electric motor, and is composed of a three-phase switching element forming upper and lower arms.

In the electronic control unit 9 (EC), mainly, the heat value of the power conversion circuit part 16 and the power source circuit part 17 is large, and the heat of the power conversion circuit part 16 and the power source circuit part 17 is radiated from the motor housing 11 made of aluminum alloy. In addition, in the present embodiment, a resilient functional member 36B and a lid member 36A are attached to the end surface portion of the motor housing 11 on the end portion side of the rotation shaft of the electric motor. By the resilient functional member 36B formed in the lid member 36A, the power conversion circuit part 16 is pushed toward the heat radiation portions formed on the end surface of the motor housing 11, such that the power conversion circuit part 16 is pushed and held to heat radiation portions.

The connector terminal assembly 13 made of synthetic resin is provided between the control circuit part 18 and the metal cover 12, is connected to a vehicle battery (power source) for supplying power, and is connected to other external control devices which are not shown in the drawings so as to send the present control state of the electric power steering device. Of course, it goes without saying that the connector terminal assembly 13 is connected to the power conversion circuit part 16, the power source circuit part 17 and the control circuit part 18.

The metal cover 12 has a function for accommodating the power conversion circuit part 16, the power source circuit part 17 and the control circuit part 18 so as to water-tightly seal them. In the present embodiment, the metal cover 12 is bonded and fixed to the motor housing 11 with a liquid gasket. This liquid gasket is a substance having fluidity at room temperature in general. The liquid gasket is applied to the bonded surface, and dries or becomes uniform after the lapse of a predetermined time, so as to form an elastic coating film or a film having adhesiveness. Therefore, it maintains the water-tightness of the bonded part and has a pressure resisting function. In addition, since the metal cover 12 is made of metal, it also has a function for radiating, to the outside, the heat generated in the power conversion circuit part 16 and the power source circuit part 17.

Next, the configuration and the assembling process of each component will be explained based on FIG. 4 to FIG. 9. First, in FIG. 4, the appearance of the motor housing 11 is shown, and FIG. 5 shows its cross section in the axial direction.

Figure 4:
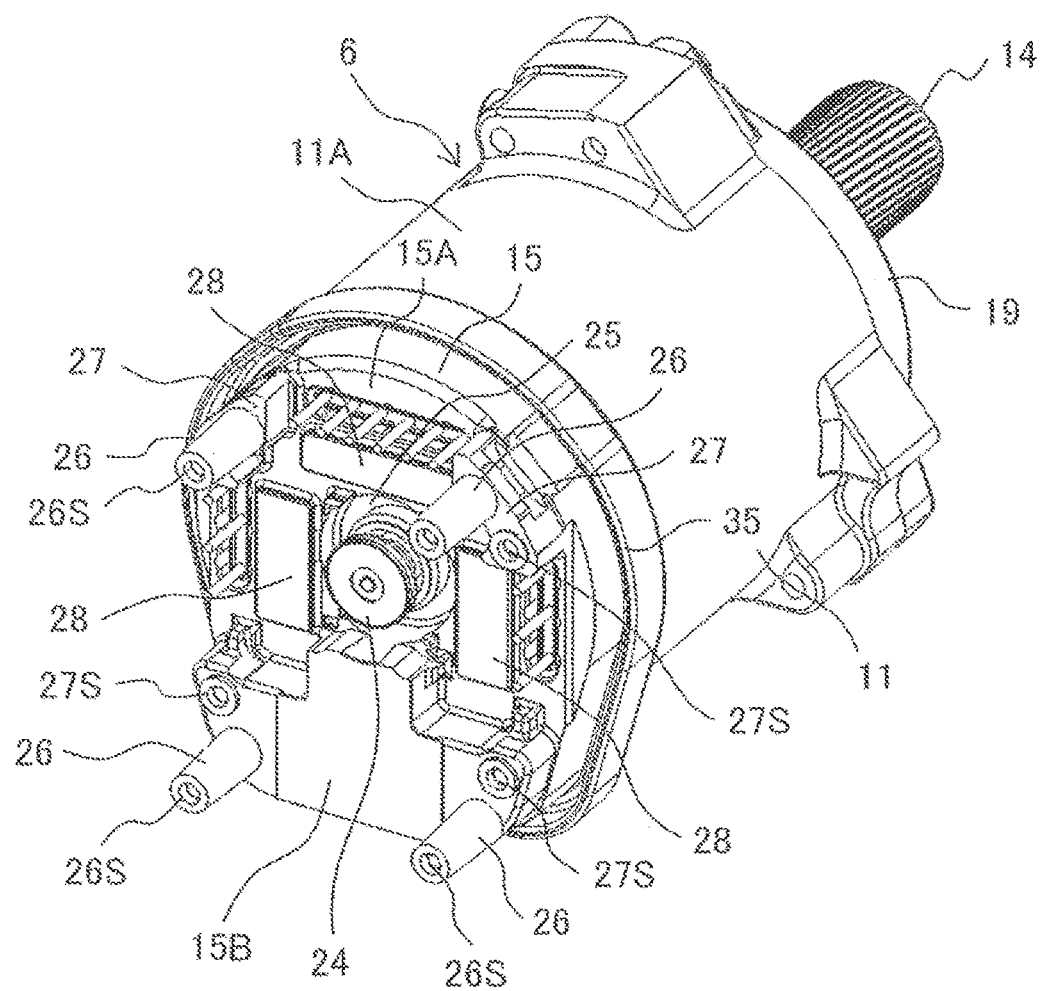
FIG. 4 is a perspective view of a motor housing shown in FIG. 3.
Figure 5:
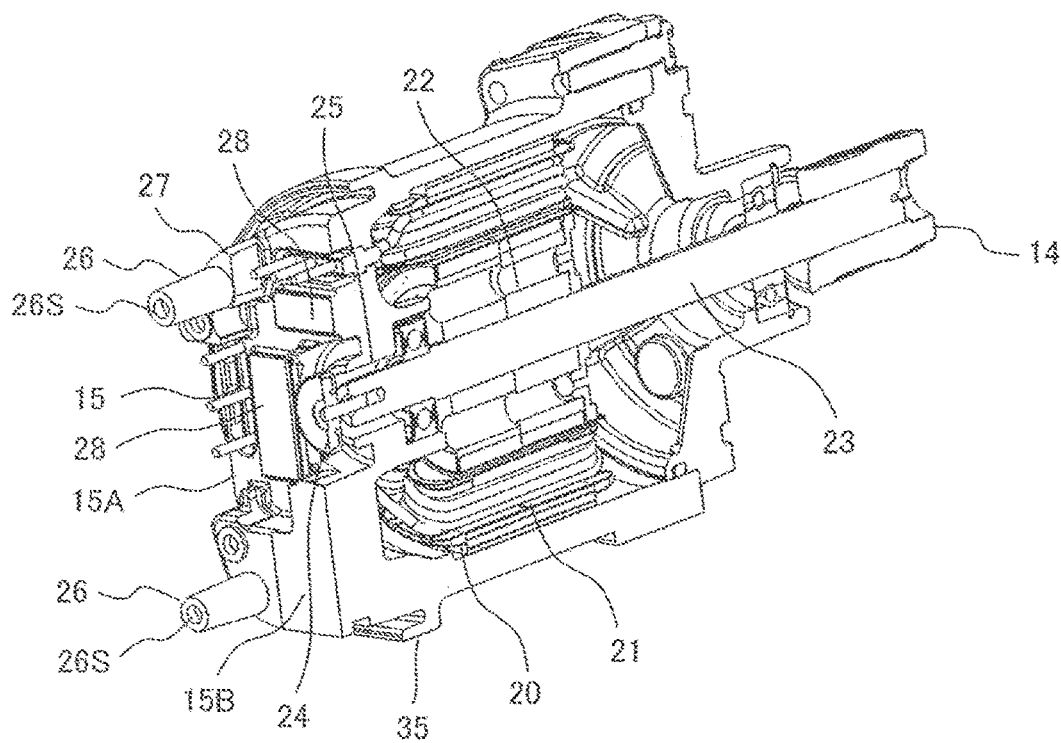
FIG. 5 is a sectional view of the motor housing shown in FIG. 4 which is taken along the axial direction.

In FIG. 4 and FIG. 5, the motor housing 11 is formed in a cylindrical shape and is composed of a side peripheral surface portion 11A, an end surface portion 15 closing one end of the side peripheral surface portion 11A, and an end surface portion 19 closing the other end of the side peripheral surface portion 11A. In the present embodiment, the motor housing 11 has a cylindrical shape with a bottom, and the side peripheral surface portion 11A is formed integrally with the end surface portion 15. In addition, the end surface portion 19 functions as a lid, so as to close the other end of the side peripheral surface portion 11A, after the electric motor is accommodated in the side peripheral surface portion 11A.

As shown in FIG. 5, a stator 21 in which a coil 20 is wound around an iron core is fitted to the inside of the side peripheral surface portion 11A, and a rotor 22 having a permanent magnet embedded therein is rotatably accommodated in the stator 21. A rotation shaft 23 is fixed to the rotor 22, and one end of the rotation shaft 23 is an output portion 14 and the other end is a rotation detection part 24 for detecting the rotation phase and the rotation speed of the rotation shaft 23. A permanent magnet is provided to the rotation detection part 24, and the rotation detection part 24 protrudes outward so as to pass through a through hole 25 provided to the end surface portion 15. Then, by a magnetism sensing portion composed of, for example, a GMR element which is not shown in the drawings, the rotation phase and the rotation speed of the rotation shaft 23 are detected.

Turning back to FIG. 4, a heat radiation region 15A of the power conversion circuit part 16 and a heat radiation region 15B of the power source circuit part 17 are formed on the surface of the end surface portion 15 positioned on the opposite side of the output portion 14 of the rotation shaft 23. A board fixing projection portion 26 is integrally planted to each of the four corners of the end surface portion 15, and is formed with, inside thereof, a screw hole 26S. The board fixing projection portion 26 is provided to fix the after-mentioned board of the control circuit part 18. In addition, a board receiving portion 27 having the same height in the axial direction as the after-mentioned power source heat radiation region 15B is formed to the board fixing projection portion 26 standing from the after-mentioned power conversion heat radiation region 15A. The board receiving portion 27 is one for mounting the after-mentioned glass epoxy board 31 of the power source circuit part 17. A plane region in the radial direction orthogonal to the rotation shaft 23 which forms the end surface portion 15 is divided into two regions. One of the two regions forms the power conversion heat radiation region 15A to which the power conversion circuit part 16 is attached, and the other forms the power source heat radiation region 15B to which the power source circuit part 17 is attached. In the present embodiment, the area of the power conversion heat radiation region 15A is larger than that of the power source heat radiation region 15B, in order to ensure the installation area of the power conversion circuit part 16, because, as mentioned above, a double system is adopted.

The power conversion heat radiation region 15A and the power source heat radiation region 15B have level differences having different heights in the axial direction (direction in which the rotation shaft 23 extends). That is, the power source heat radiation region 15B is formed to have a level difference in a direction away from the power conversion heat radiation region 15A when viewed in the direction of the rotation shaft 23 of the electric motor. This level difference is set to have a length in which the power conversion circuit part 16 and the power source circuit part 17 do not interfere with each other when the power source circuit part 17 is disposed after the power conversion circuit part 16 is disposed.

Three long and narrow rectangular protruding placement parts 28 are formed in the power conversion heat radiation region 15A. The after-mentioned double-system power conversion circuit part 16 is disposed on each of the protruding placement parts 28. In addition, each of the protruding placement parts 28 protrudes in a direction away from the electric motor when viewed in the direction of the rotation shaft 23 of the electric motor.

In addition, the power source heat radiation region 15B has a plane shape, and the after-mentioned power source circuit part 17 is disposed thereon. Therefore, the protruding placement parts 28 each function as a heat radiation portion for transferring the heat generated in the power conversion circuit part 16 to the end surface portion 15, and the power source heat radiation region 15B functions as a heat radiation portion for transferring the heat generated in the power source circuit part 17 to the end surface portion 15.

In this way, in the end surface portion 15 of the motor housing 11 in the present embodiment, a heat sink member is omitted, and a length in the axial direction can be shortened. In addition, since the motor hosing 11 has a sufficient heat capacity, the heat of the power source circuit part 17 and the power conversion circuit part 16 can be efficiently radiated to the outside.

Figure 6:
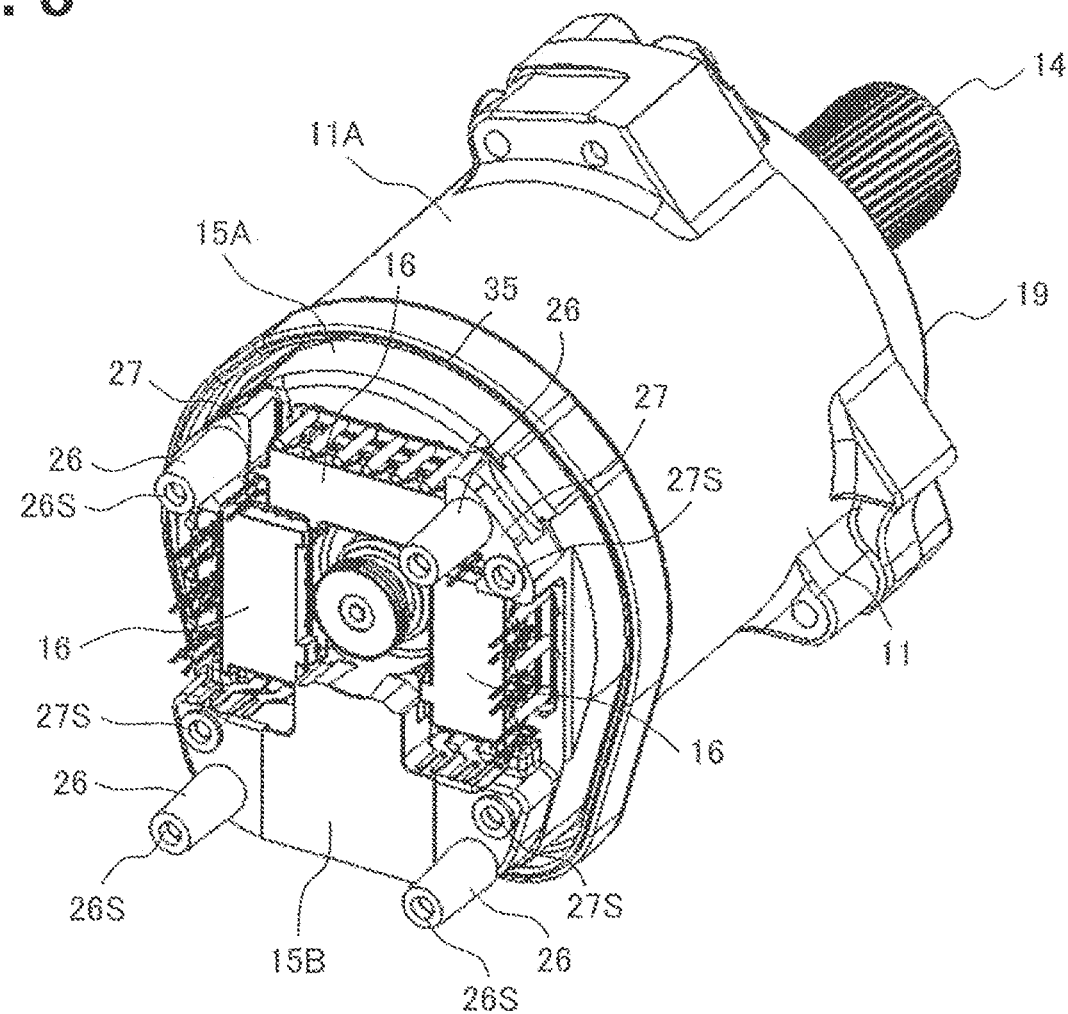
FIG. 6 is a perspective view showing a state in which a power conversion circuit part is mounted on the motor housing shown in FIG. 4.

Next, FIG. 6 shows a state in which the power conversion circuit part 16 is disposed on each of the protruding placement parts 28. As shown in FIG. 6, the power conversion circuit part 16 constituted in a double-system is disposed on each of the protruding placement parts 28 formed in the power conversion heat radiation region 15A. A switching element composing the power conversion circuit part 16 is mounted on each metal board (here, aluminum-based metal is used), so as to radiate heat easily, and the power conversion circuit part 16 is packaged with synthetic resin, including the switching element and the metal board on the switching element side.

Accordingly, the metal boards of power conversion circuit parts 16 are thermally connected to the respective protruding placement parts 28. Consequently, the heat generated in the switching elements can be efficiently transferred to the protruding placement parts 28. Preferably, heat conductive grease is applied between the metal boards of the power conversion circuit parts 16 and the protruding placement parts 28, so as to transfer the heat of the power conversion circuit parts 16 to the protruding placement parts 28 easily. In addition, also as shown in FIG. 3, the power conversion circuit parts 16 are pushed to and held on the protruding placement parts 28 side by the resilient functional member 36B of the lid member 35A attached to the end portion of the rotation shaft 23.

The heat transferred to the protruding placement parts 28 is diffused to the power conversion heat radiation region 15A, is transferred to the side peripheral surface portion 11A of the motor housing 11, and then is radiated to the outside. Here, as mentioned above, since the height in the axial direction of each of the power conversion circuit parts 16 is lower than that of the power source heat radiation region 15B, the power conversion circuit parts 16 do not interfere with the after-mentioned power source circuit part 17.

Figure 7:
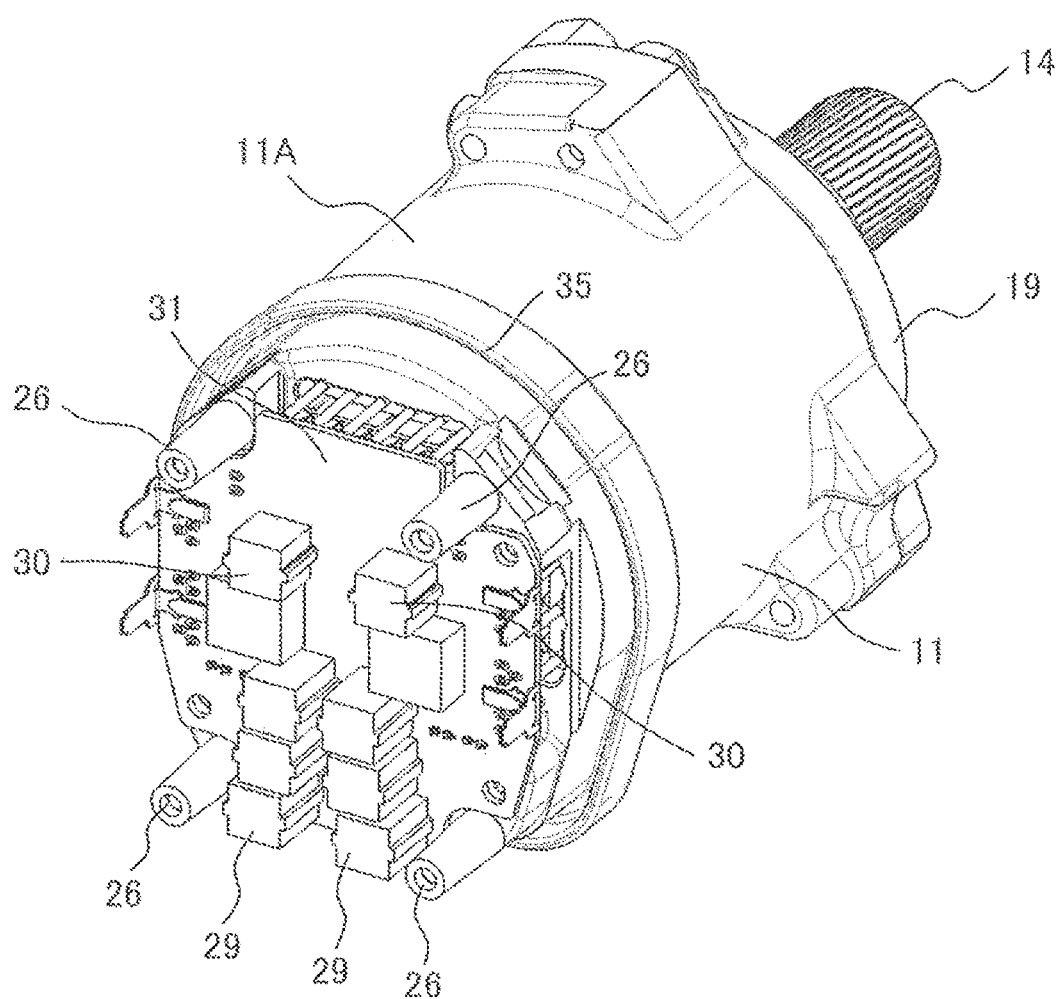
FIG. 7 is a perspective view showing a state in which a power source circuit part is mounted on the motor housing shown in FIG. 6.

Next, FIG. 7 shows a state in which the power source circuit part 17 is disposed over the power conversion circuit parts 16. As shown in FIG. 7, the power source circuit part 17 is disposed on the power source heat radiation region 15B. Capacitors 29, coils 30 and the like composing the power source circuit part 17 are mounted on the glass epoxy board 31. The power source circuit part 17 also adopts a double system, and as is clear from FIG. 7, power source circuits composed of the capacitors 29, the coils 30 and the like are symmetrically formed.

The surface on the power source heat radiation region 15B side of the glass epoxy board 31 is fixed to the end surface portion 15 so as to come in contact with the power source heat radiation region 15B. In a method for the fixing, as shown in FIG. 6, the glass epoxy board 31 is fixed with fixing bolts via screw holes, which are not shown in the drawings, provided to the board receiving portions 27 of the board fixing projection portions 26. In addition, it is fixed with fixing bolts via screw holes 27S provided to the power source heat radiation region 15B.

In addition, since the power source circuit part 17 is formed by the glass epoxy board 31, double-side mounting becomes possible. Then, GMR elements, which are not shown in the drawings, and a rotation phase detection part and a rotation speed detection part composed of detection circuits of the GMR elements are mounted on the surface on the power source heat radiation region 15B side of the glass epoxy board 31 so as to detect the rotation phase and the rotation speed of the rotation shaft 23, in cooperation with the rotation detection part 24 provided to the rotation shaft 23.

In this way, since the glass epoxy board 31 is fixed so as to come in contact with the power source heat radiation region 15B, the heat generated in the power source circuit part 17 can be efficiently transferred to the power source heat radiation region 15B. The heat transferred to the power source heat radiation region 15B is transferred to the side peripheral surface portion 11A of the motor housing 11, and is radiated to the outside. Here, one of adhesive, heat radiating grease and a heat radiating sheet having well heat transfer can be interposed between the glass epoxy board 31 and the power source heat radiation region 15B, and thereby heat transfer performance can be further improved.

Figure 8:
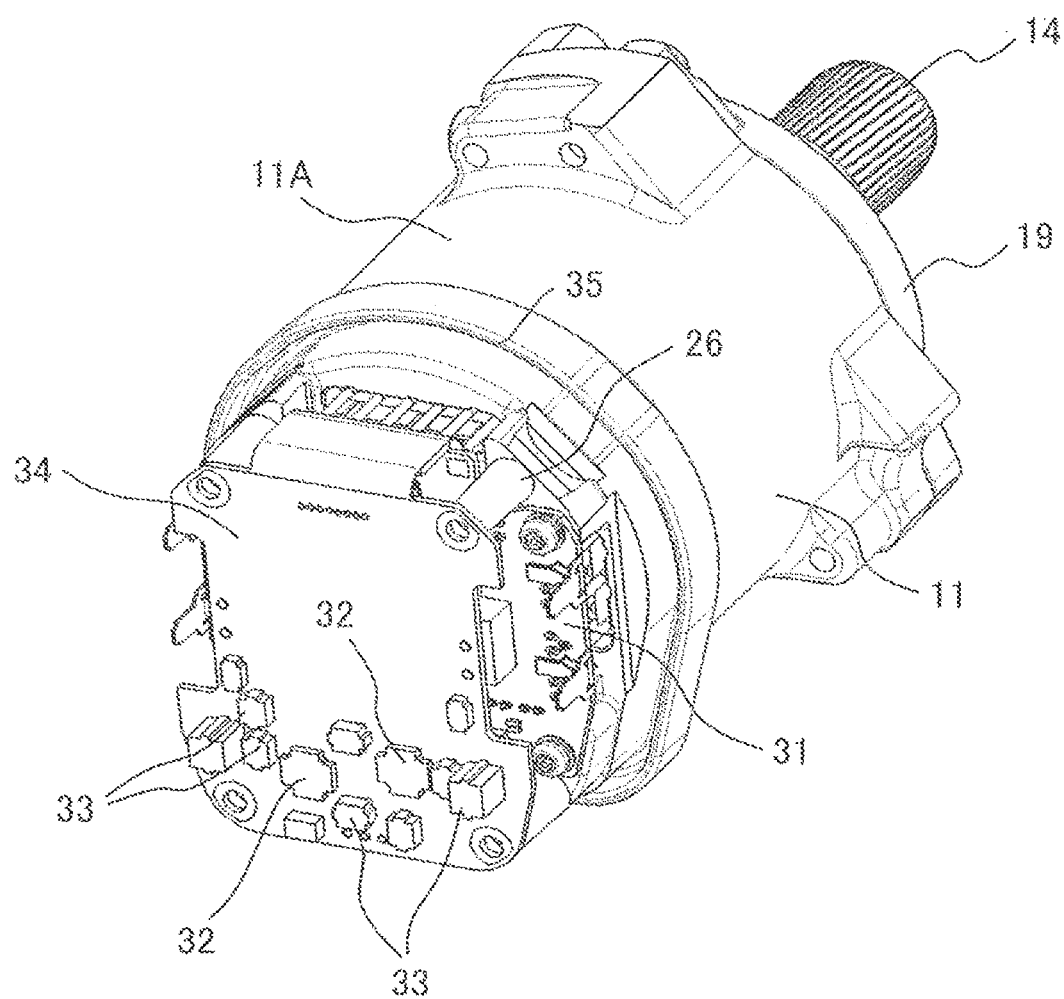
FIG. 8 is a perspective view showing a state in which a control circuit part is mounted on the motor housing shown in FIG. 7.

Next, FIG. 8 shows a state in which the control circuit part 18 is disposed over the power source circuit part 17. As shown in FIG. 8, the control circuit part 18 is disposed above the power source circuit part 17. Microcomputers 32 and peripheral circuits 33 composing the control circuit part 18 are mounted on a glass epoxy board 34 that is a mounting board. A double system is also adopted to the control circuit part 18, and, as is clear from FIG. 8, control circuits constituted of the microcomputers 32 and the peripheral circuits 33 are symmetrically formed. In addition, the microcomputers 32 and the peripheral circuits 33 may be provided to the surface on the power source circuit part 17 side of the glass epoxy board 34.

As shown in FIG. 8, the glass epoxy board 34 is fixed to bolt holes 26S provided to the top portions of the board fixing projection portions 26 (see FIG. 6) with fixing bolts which are not shown in the drawings in a state of being sandwiched with the connector terminal assembly 13, and the space between the glass epoxy board 31 of the power source circuit part 17 (see FIG. 7) and the glass epoxy board 34 of the control circuit part 18 serves as a space in which the capacitors 29, the coils 30 and the like of the power source circuit part 17 shown in FIG. 7 are disposed.

According to the present embodiment, the power conversion circuit parts 16 are disposed on the protruding placement parts 28 formed in the power conversion heat radiation region 15A. Consequently, the heat generated in the switching elements of the power conversion circuit parts 16 can be efficiently transferred to the protruding placement parts 28. Moreover, the heat transferred to the protruding placement parts 28 is diffused to the power conversion heat radiation region 15A, is transferred to the side peripheral surface portion 11A of the motor housing 11, and then is radiated to the outside.

Similarly, the power source circuit part 17 is disposed on the power source heat radiation region 15B. The surface on the power source heat radiation region 15B side of the glass epoxy board 31 on which circuit elements of the power source circuit part 17 are mounted is fixed to the end surface portion 15 so as to come in contact with the power source heat radiation region 15B. Therefore, the heat generated in the power source circuit part 17 can be efficiently transferred to the power source heat radiation region 15B. The heat transferred to the power source heat radiation region 15B is transferred and diffused to the side peripheral surface portion 11A of the motor housing 11, and is radiated to the outside.

According to such a configuration, the heat generated in at least the power source circuit part 17 and the power conversion circuit parts 16 is transferred to the end surface portion 15 of the motor housing 11, and thereby the length in the axial direction can be shortened by omitting a heat sink member. In addition, since the motor hosing 11 has a sufficient heat capacity, the heat of the power source circuit part 16 and the power conversion circuit parts 17 can be efficiently radiated to the outside.

Figure 9:
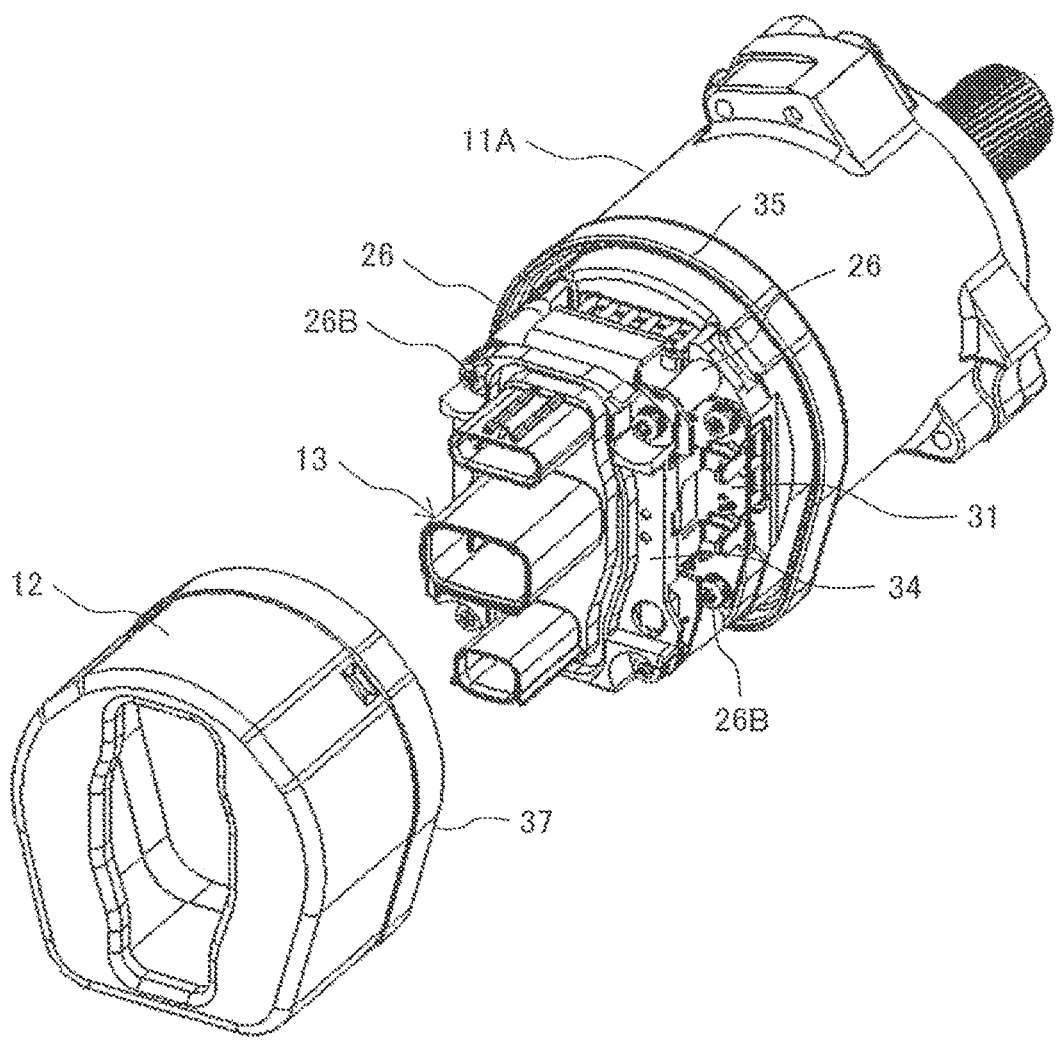
FIG. 9 is an external perspective view showing a state in which a connecter terminal assembly is mounted on and fixed to the motor housing shown in FIG. 8.

Next, in FIG. 9, a state in which the connector terminal assembly 13 is disposed over the control circuit part 18 is shown. As shown in FIG. 9, the connecter terminal assembly 13 is disposed above the control circuit part 18. Then, the connector terminal assembly 13 is fixed to the screw holes 26S provided to the top portions of the board-connector fixing projection portions 26 with fixing screws 26B so as to sandwich the glass epoxy board 34 of the control circuit part 18. In this state, as shown in FIG. 3, the connector terminal assembly 13 is electrically connected to the power conversion circuit parts 16, the power source circuit part 17 and the control circuit part 18.

Moreover, an opening end 37 of the metal cover 12 engages with a step part 35 of the motor housing 11, and is fixed by being caulked in a fixing region provided to the outer peripheral direction. As mentioned above, the annular step part 35 on the motor housing side which is formed to the end peripheral surface of the end surface portion 15 engages with the opening end 37 of the metal cover 12 in a fixing manner called "spigot joint engagement" or "spigot joint fitting".

Then, as mentioned in the section of "PROBLEM(S) TO BE SOLVED BY THE INVENTION", in an accommodation space of an electronic control unit, internal pressure fluctuations occur due to the effect of the heat generation of the electronic control unit itself. Consequently, when the pressure of the accommodation space becomes higher than that of the outside due to temperature fluctuations, there is possibility that an adhesive or an O-ring is peeled off from a sealing surface, and a waterproof function is lost. In addition, when the pressure of the accommodation space becomes lower than that of the outside, it is expected that water penetrates from the gap of the adhesive or the O-ring, and there is possibility that an electric component of the electronic control unit is damaged caused by the water penetration. The buffering of the internal pressure fluctuations of the accommodation space is therefore required.

In addition, in this type of the electronic control unit, a switching element such as MOSFET for controlling and driving an electric motor is used, and its heating value is large. Although the heat generated in the switching element is radiated to the outside by, for example, a heat sink, the heat radiation by the heat sink is limited due to a requirement for a reduction in the size of the power steering device. Therefore, an improvement in heat radiation performance is further required.

Thus, in the present embodiment, the following configuration is proposed. In FIG. 10 and FIG. 11, as mentioned above, a protruding placement part 28 protruding toward the electronic control unit is disposed in the power conversion heat radiation region 15A formed to the end surface portion 15 of the motor housing. A power conversion circuit part 16 is placed on the protruding placement part 28. The power conversion circuit part 16 is packaged with synthetic resin, and is pressed and fixed to the protruding placement part 28 by a resilient functional member 36B.

Here, the power conversion circuit part 16 is an electronic component composed of a switching element such as MOSFET, is treated as a heating element having a large heating value, and corresponds to a cooling object member.

An air circulation passage 38A parallel to a rotation shaft 23 which is opened penetrating toward the surface of a protruding placement part 28 is formed inside the end surface portion 15 of the motor housing 11. This air circulation passage 38A is connected to an air circulation passage 38B formed so as to be orthogonal to the rotation shaft 23. The air circulation passage 38B is opened to the outer peripheral surface of the end surface portion 15 of the motor housing 11, and thereby an accommodation space Sp of the electronic control unit is in fluid communication with the outside of the motor housing 11. Consequently, the going in and out of air become possible.

A waterproof moisture-permeable film 39 is attached to the opening surface of the air circulation passage 38B opened to the outer peripheral surface of the end surface portion 15 of the motor housing 11. The waterproof moisture-permeable film 39 has a function in which the passage of moisture is prohibited and the passage of water vapor and air is permitted, in order to suppress the entering of moisture when the accommodation space Sp becomes a negative pressure due to internal pressure fluctuations. In addition, the air circulation passage 38B is not only opened to the outer peripheral surface of the end surface portion 15 of the motor housing 11, but also can be opened to the accommodation space of the electric motor of the motor housing 11. In this case, the accommodation space of the motor housing 11 is connected to the outside via another passage.

Then, an opening region 40 where the air circulation passage 38A penetrates is formed to the surface of the protruding placement part 28, and a divided air circulation passage 41 extends radially outward with the middle of the opening region 40 as a center (see FIG. 11). That is, as shown in FIG. 11, the surface of the protruding placement part 28 is formed with three grooves recessed toward the motor housing 11, and has a heat radiation function obtained by the contact with the power conversion circuit part 16 and the air flowing through the divided air circulation passage 41.

This configuration is shown in FIG. 11, and the surface of the protruding placement part 28 is formed with the opening region 40, and a contact portion 28C and the groove-shaped divided air circulation passage 41 with the middle of the opening region 40 as a center are formed. The divided air circulation passage 41 has three groove-shaped passages formed on the surface of the protruding placement part 28, and the air circulation passage 38A is connected to the center where these passages intersect with each other. Accordingly, the surface of the protruding placement part 28 except the surface where the divided air circulation passage 41 is formed becomes the contact portion 28C. The groove-shaped divided air circulation passage 41 may be formed by machining (cutting), or may be formed by a mold.

Then, in the groove-shaped divided air circulation passage 41, the placement surface (wall surface) of the power conversion circuit part 16 functions as a part of the divided air circulation passage 41 in a state in which the power conversion circuit part 16 is placed on the protruding placement part 28. That is, since the air flowing through the groove-shaped divided air circulation passage 41 flows while coming in contact with the placement surface of the power conversion circuit part 16, the heat of the power conversion circuit part 16 is taken. Moreover, the groove-shaped divided air circulation passage 41 extends over substantially the whole surface of the protruding placement part 28, so as to take the heat from a wide area of the placement surface of the power conversion circuit part 16 placed on the protruding placement part 28.

The further importance is that a total circulation cross-sectional area (Sd) of the divided air circuit passage 41 is set to a value smaller than the circulation cross-sectional area (Sb) of the air circulation passages 38A and 38B which have not been divided. Consequently, the flow velocity of the air flowing through the divided air circulation passage 41 can be increased, and the heat generated in the power conversion circuit part 16 can be efficiently radiated.

In addition, the air which has taken the heat is released to the outside from the opening of the air circulation passage 38B formed on the outer peripheral surface of the end surface portion 15 of the motor housing 11. Accordingly, the power conversion circuit part 16 is efficiently cooled as compared with a conventional one, and thereby improving heat radiation performance.

On the other hand, when the accommodation space Sp becomes a negative pressure, although outside air having a low temperature which is taken from the air circulation passage 38B flows through the air circulation passage 38A and the divided air circulation passage 41, and then enters into the accommodation space Sp, at this time, the air also takes heat from a large area of the placement surface of the power conversion circuit part 16 placed on the protruding placement part 28, and then is released to the accommodation space Sp. The air which has taken the heat is radiated to the outside via the metal cover 12 and the end surface portion 15 of the motor housing 11.

In this way, since the accommodation space Sp of the electronic control unit is connected to the outside via the air circulation passages 38A and 38B, internal pressure fluctuations can be buffered, and, moreover, by increasing the flow velocity of the air flowing through the divided air circulation passage 41 on the accommodation space SP side of the air circulation passages 38A and 38B to radiate efficiently the heat of the power conversion circuit part (heating element) 16 that is a cooling object member.

Furthermore, as mentioned above, although heat transfer grease can be applied between the power conversion circuit part 16 and the protruding placement part 28, by providing a divided air circulation passage, the use of the heat transfer grease can be abolished, and an effect of a decrease in manufacturing costs can be also expected.

Figure 12A:
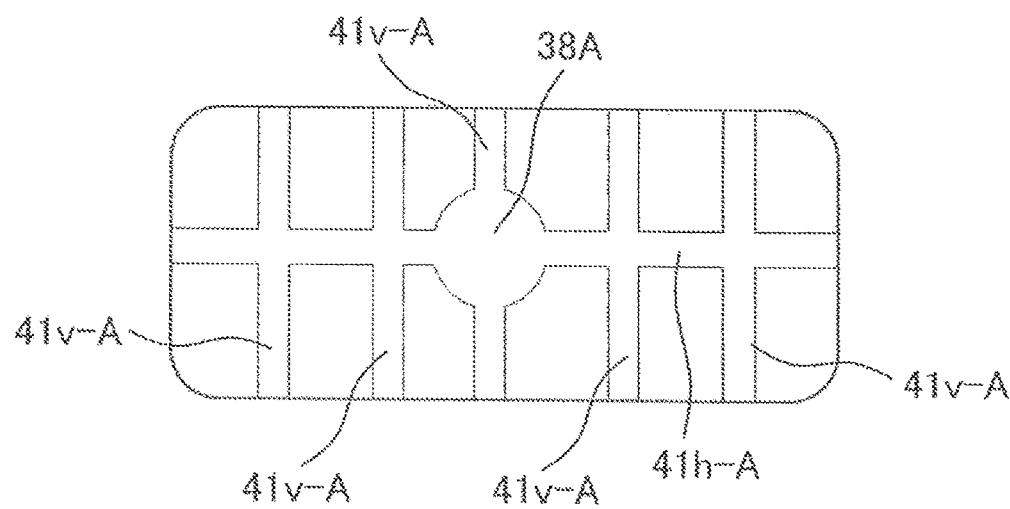
FIG. 12A is a top view showing a variation of the divided air circulation passage shown in FIG. 11.

FIG. 12A shows a variation of the divided air circulation passage 41. In this variation, the protruding placement part 28 is formed with a divided air circulation passage (longitudinal direction) 41*h*-A extending in the longitudinal direction so as to intersect the air circulation passage 38A, and a plurality of divided air circulation passages (short-side direction) 41*v*-A extending in the short-side direction so as to be orthogonal to the divided air circulation passage 41*h*-A.

Figure 12B:
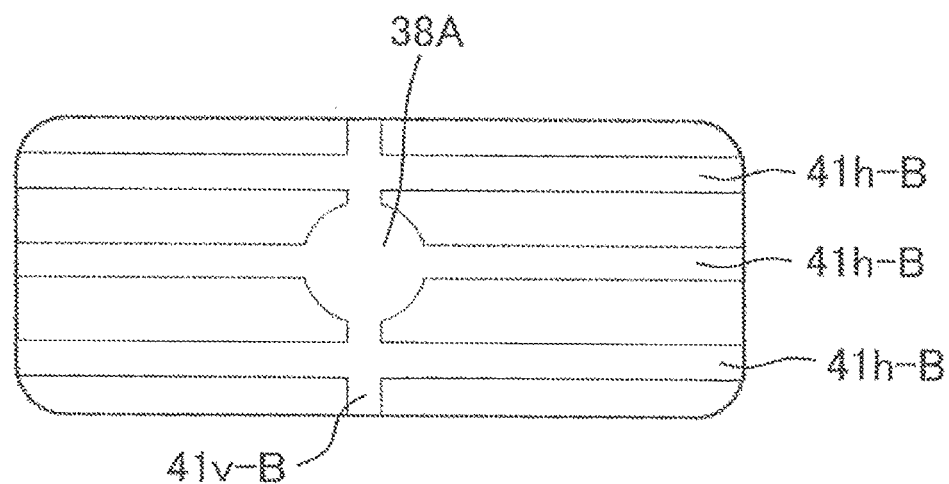
FIG. 12B is a top view showing another variation of the divided air circulation passage shown in FIG. 11.

In addition, FIG. 12B also shows a variation of the divided air circulation passage 41. In this variation, the protruding placement part 28 is formed with a divided air circulation passage (short-side direction) 41*v*-B extending in the short-side direction so as to intersect the air circulation passage 38A, and a plurality of divided air circulation passages (longitudinal direction) 41*h*-B extending in the longitudinal direction so as to be orthogonal to the divided air circulation passage 41*v*-B.

In these variations, the groove-shaped divided air circulation passage 41 extends over substantially the whole surface of the protruding placement part 28, so as to take the heat from a wide area of the placement surface of the power conversion circuit part 16 placed on the protruding placement part 28.

Second Embodiment

Next, a second embodiment of the present invention will be explained. In the second embodiment, the metal cover 12 is formed with an air circulation passage 42.

Figure 13:
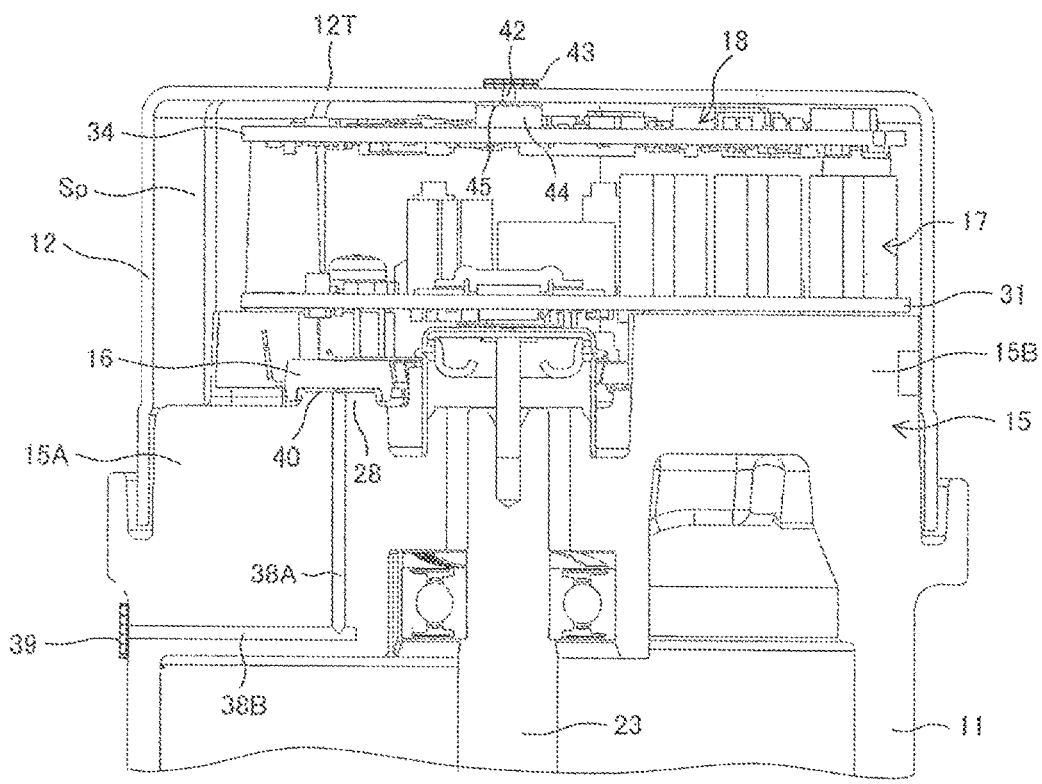
FIG. 13 is a sectional view for explaining a main part of the electric power steering device in a second embodiment of the present invention.

In FIG. 13, in the present embodiment, the connector terminal assembly 13 extends in the direction orthogonal to the axis of the rotation shaft 23, is exposed to the outside through the opening formed to the side surface of the metal cover 12, and is not shown. In addition, by that configuration, the total length of the metal cover 12 becomes lower than that in the first embodiment.

Similar to the first embodiment, an opening region 40 is formed to the surface of the protruding placement part 28, and a groove-shaped divided air circulation passage 41 centering around the middle is formed. The divided air circulation passage 41 is three groove-shaped passages formed on the surface of the protruding placement part 28, and an air circulation passage 38A is connected to the center in which these passages intersect with each other. This configuration is the same as that shown in FIG. 10, and its explanation is therefore omitted.

On the other hand, in addition to the above configuration of the present embodiment, an air circulation passage 42 penetrating through a top 12T of the metal cover 12 is formed, and by this air circulation passage 42, the accommodation space Sp is connected to the outside. In addition, a waterproof moisture-permeable film 43 is attached to the outer side of the metal cover 12 to which the air circulation passage 42 is opened. This waterproof moisture-permeable film 43 also has a function in which the passage of moisture is prohibited and the passage of water vapor and air is permitted. Here, since the metal cover 12 is formed with the air circulation passage 42 in the present embodiment, a divided air circulation passage 41 like the first embodiment cannot be formed.

Therefore, in the present embodiment, a divided air circulation passage 45 is formed by using a synthetic resin package of a microcomputer that is a heating element. Here, a microcomputer that is an electronic component composing the control circuit part 18 corresponds to a "cooling object member".

In FIG. 13, a microcomputer 44 (corresponding to a microcomputer 32 shown in FIG. 8) composing the control circuit part 18 is disposed so as to come in tight contact with the inner wall surface of the metal cover 12. In addition, the microcomputer 44 (hereinafter is referred to as a packaged microcomputer) is surrounded with synthetic rein, and, on one surface side thereof, the divided air circulation passage 45 radially extends outward.

Figure 14:
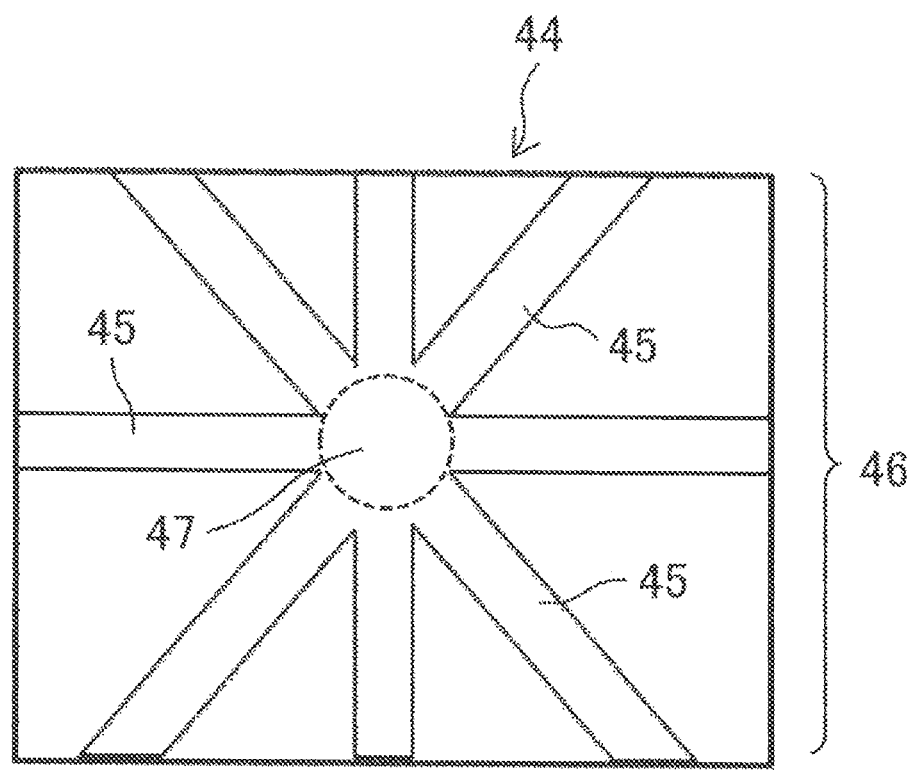
FIG. 14 is a top view when viewing, from the upper surface, an electronic component that is a heat generating element shown in FIG. 13.

That is, as shown in FIG. 14, a divided air circulation passage 45 divided into three grooves is formed to the surface of the synthetic resin accommodating the microcomputer 44. Then, in a state of coming in tight contact with the metal cover 12, the divided air circulation passage 45 forms a passage through which air flows, cooperating with the inner wall surface of the metal cover 12.

In FIG. 14, an opening region 46 is formed on the flat outer surface of the synthetic resin forming the packaged microcomputer 44, and the groove-shaped divided air circulation passage 45 radially extending outward which centers the middle of the opening region 46 is formed.

The divided air circulation passage 45 is formed of a three groove-shaped passages formed on the outer surface of the packaged microcomputer 44, and in the center in which these passages intersect with each other, a gathering portion 47 connected to the air circulation passage 42 is formed. In addition, this groove-shaped divided air circulation passage 45 is formed by a mold of synthetic resin. Moreover, it can be formed to have the shape of the divided air circulation passage shown in FIG. 12A and FIG. 12B.

Then, in a state of coming in tight contact with the inner wall surface of the metal cover 12, the packaged microcomputer 44 forms the divided air circulation passage 45 of the packaged microcomputer 44. With this, the air flowing through the groove-shaped divided air circulation passage 45 flows while coming in contact with the packaged microcomputer 44, thereby taking the heat of the packaged microcomputer 44. Moreover, the groove-shaped divided air circulation passage 45 extends over substantially the whole surface of the outer surface (opening region 46) of the packaged microcomputer 44, so as to take the heat from a wide area of the outer surface (opening region 46) of the packaged microcomputer 44.

In addition, similar to the first embodiment, a total circulation cross-sectional area (Sd) of the divided air circulation passage 45 is set to a value smaller than a circulation cross-sectional area (Sb) of the air circulation passage 42 which has not not divided. Consequently, the flow velocity of the air flowing through the divided air circulation passage 45 can be increased, and when the flow velocity of the air is increased, a heat transfer coefficient can be increased, thereby efficiently radiating the heat generated in the packaged microcomputer 44.

In addition, the air which has taken the heat is released, via the air circulation passage 42, to the outside from the opening formed on the outer surface of the metal cover 12. Accordingly, the packaged microcomputer 44 is efficiently cooled as compared with a conventional one, and thereby improving heat radiation performance.

On the other hand, when the accommodation space Sp becomes a negative pressure, although outside air having a low temperature which is taken from the air circulation passage 42 flows through the divided air circulation passage 45, and then enters into the accommodation space Sp, at this time, the air also takes heat from a large area of the opening region 46 formed to the packaged microcomputer 44, and then is released to the accommodation space Sp. The air which has taken the heat is radiated to the outside via the metal cover 12 and the end surface portion 15 of the motor housing 11.

In this way, in the present embodiment, since the accommodation space Sp of the electronic control unit is connected to the outside via the air circulation passage 42, internal pressure fluctuations can be also buffered, and, moreover, by increasing the flow velocity of the air flowing through the divided air circulation passage 45 on the accommodation space Sp side of the air circulation passage 42, the heat of the microcomputer (heating element) 44 that is a "cooling object member" can be radiated efficiently.

Third Embodiment

Next, a third embodiment will be explained. In the first embodiment and the second embodiment, heat generated from heating elements such as a switching element and a microcomputer is taken by providing a divided air circulation passage. However, in the present embodiment, a configuration for efficiently radiate the heat inside the accommodation space Sp is proposed.

Figure 15:
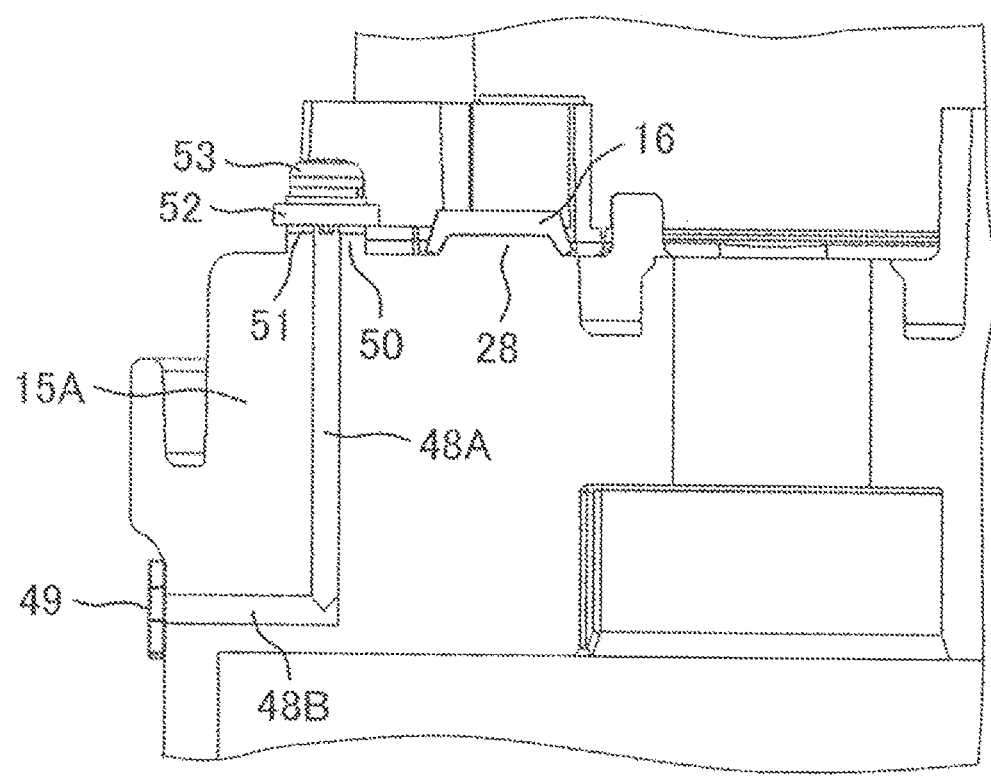
FIG. 15 is a sectional view for explaining a main part of the electric power steering device in a third embodiment of the present invention.
Figure 16:
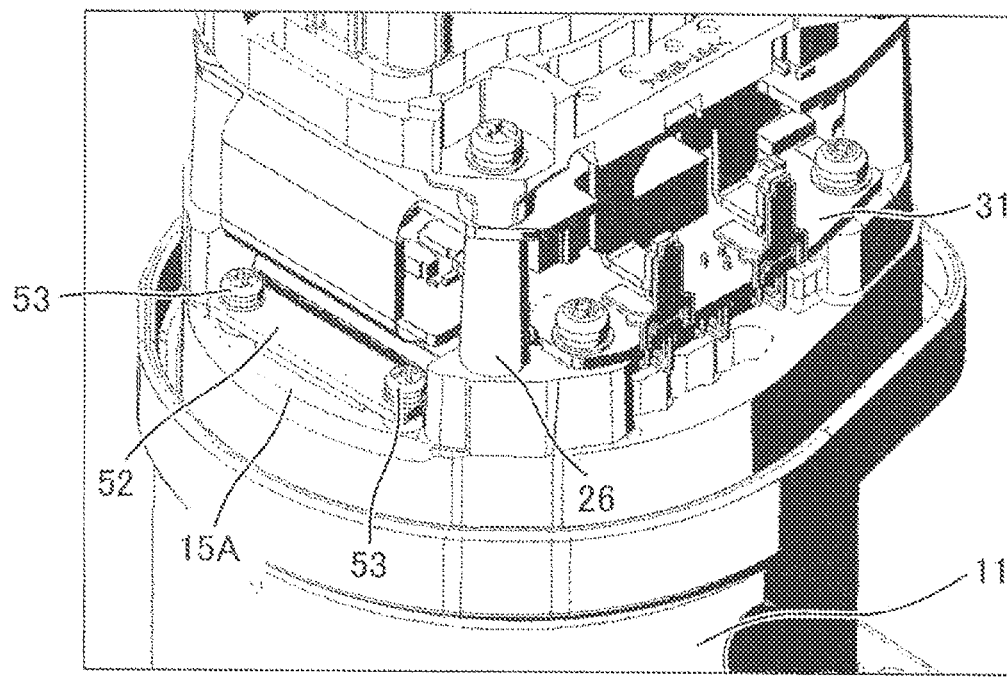
FIG. 16 is a perspective view when diagonally viewing, from the upper side, the illustration of FIG. 15.
Figure 17:
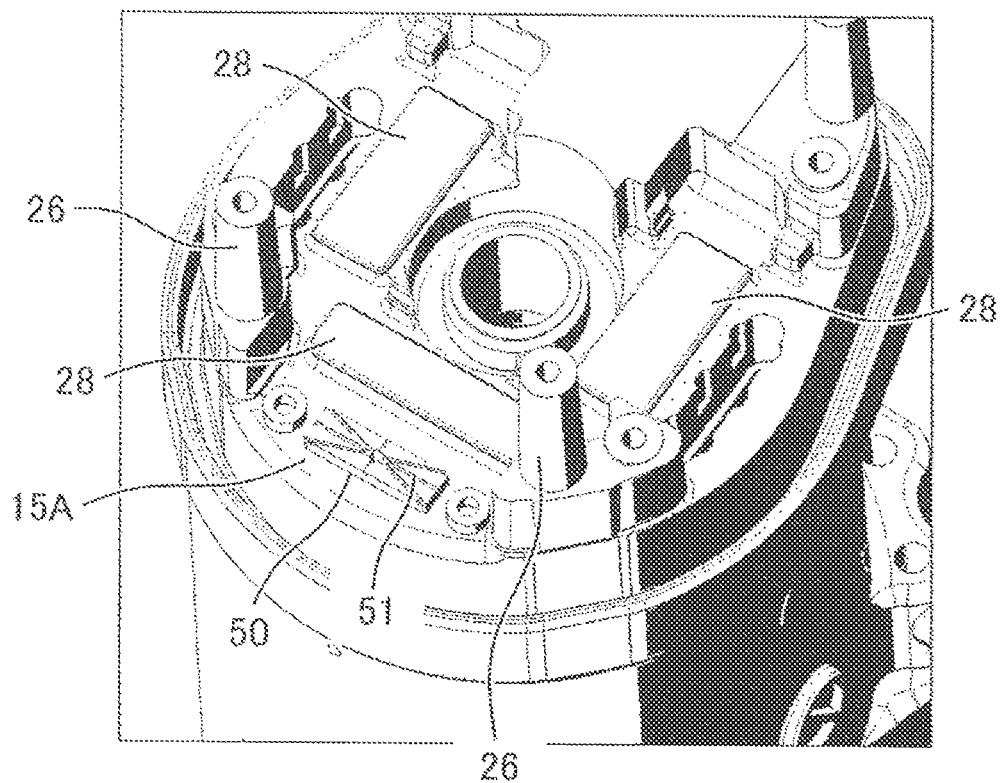
FIG. 17 is a perspective view when diagonally viewing, from the upper side, a state in which a heat transfer functional member shown in FIG. 15 is detached.

In FIG. 15 to FIG. 17, as mentioned above, a protruding placement part 28 extending toward the electronic control unit is formed in the power conversion heat radiation region 15A formed on the end surface portion 15 of the motor housing 11. A power conversion circuit part 16 is placed on the protruding placement part 28. The power conversion circuit part 16 is packaged with synthetic resin, and is pressed toward the protruding placement part 28 by a resilient functional member 36 so as to be fixed.

In the inside of the end surface portion 15 of the motor housing 11, an air circulation passage 48A formed parallel to the rotation shaft 23 is opened to and penetrates through the surface of the power conversion heat radiation region 15A so as to be adjacent to the protruding placement part 28. In addition, this air circulation passage 48A is connected to an air circulation passage 48B formed so as to be orthogonal to the rotation shaft 23. The air circulation passage 48B is opened to the outer peripheral surface of the end surface portion 15 of the motor housing 11, and thereby an accommodation space Sp of the electronic control unit is in fluid communication with the outside of the motor housing 11. Consequently, the going in and out of air become possible.

A waterproof moisture-permeable film 49 is attached to the opening surface of the air circulation passage 48B opened to the outer peripheral surface of the end surface portion 15 of the motor housing 11. The waterproof moisture-permeable film 49 has a function in which the passage of moisture is prohibited and the passage of water vapor and air is permitted, in order to suppress the entering of moisture when the accommodation space Sp becomes a negative pressure due to internal pressure fluctuations.

In addition, similar to the first embodiment, the air circulation passage 48B is not only opened to the outer peripheral surface of the end surface portion 15 of the motor housing 11, but also can be opened to the accommodation space of the electric motor of the motor housing 11. In this case, the accommodation space of the motor housing 11 is connected to the outside via another passage.

Then, an opening region 50 (see, FIG. 17) having the similar configuration of the first embodiment where the air circulation passage 48A penetrates is formed to the surface of the power conversion heat radiation region 15A adjacent to the protruding placement part 28. As shown in FIG. 17, a divided air circulation passage 51 extends radially outward with the middle of the opening region 50 as a center. That is, the surface of the power conversion heat radiation region 15A is formed with three grooves recessed toward the motor housing 11.

This configuration is shown in FIG. 17, and the surface of the power conversion heat radiation region 15A is formed with the opening region 50, and the groove-shaped divided air circulation passage 51 centering the middle of the opening region 40 is formed. The divided air circulation passage 51 has three groove-shaped passages formed on the surface of the power conversion heat radiation region 15A, and the air circulation passage 48A is connected to the center where these passages intersect with each other. The groove-shaped divided air circulation passage 51 may be formed by machining (cutting), or may be formed by a mold. In addition, the divided air circulation passage may be formed in the shape shown in FIG. 12A or FIG. 12B.

A flat-plate-shaped heat transfer functional member 52 corresponding to a "cooling object member" is placed in the opening region 50, and in a state in which the heat transfer functional member 52 is placed in the opening region 50, the placement surface (wall surface) of the heat transfer functional member 52 functions as a part of the divided air circulation passage 51. In addition, the flat-plate-shaped heat transfer functional member 52 is fixed to the power conversion heat radiation region 15A at the both ends of the opening region 50 by fixing bolts 53.

Then, since the air flowing through the groove-shaped divided air circulation passage 51 flows while coming in contact with the placement surface of the heat transfer functional member 52, the heat of the heat transfer functional member 52 is taken. Moreover, the groove-shaped divided air circulation passage 51 extends over substantially the whole surface of the opening region 50, so as to take the heat from a wide area of the placement surface of the heat transfer functional member 52 placed in the opening region 50.

The heat transfer functional member 52 is made of a metal excellent in heat transfer performance such as aluminum alloy and copper, and the temperature of the heat transfer functional member 52 becomes high due to the heat of the surrounding air and the radiant heat of the power conversion circuit part 16. In particular, since the opening region 50 is formed adjacent to the protruding placement part 28, the heat transfer functional member 52 easily receives the heat of the power conversion circuit part 16. The heat can be therefore efficiently radiated, from the heat transfer functional member 52, to the air flowing through the divided air circulation passage 51.

In addition, similar to the first embodiment, a total circulation cross-sectional area (Sd) of the divided air circuit passage 51 is set to a value smaller than a circulation cross-sectional area (Sb) of the air circulation passages 48A and 48B which have not been divided. Consequently, the flow velocity of the air flowing through the divided air circulation passage 51 can be increased. When the flow velocity of the air is increased, a heat transfer coefficient can be increased, thereby efficiently radiating the heat from the heat transfer functional member 52. The air which has taken the heat is released to the outside from the opening of the air circulation passage 48B formed on the outer peripheral surface of the end surface portion 15 of the motor housing 11.

On the other hand, when the accommodation space Sp becomes a negative pressure, although outside air having a low temperature which is taken from the air circulation passage 48B flows through the air circulation passage 48A and the divided air circulation passage 51, and then enters into the accommodation space Sp, at this time, the air also takes heat from a large area of the placement surface of the heat transfer functional member 52 placed in the opening region 50, and then is released to the inside of the accommodation space Sp. The air which has taken the heat is radiated to the outside via the metal cover 12 and the end surface portion 15 of the motor housing 11.

In this way, in the present embodiment, since the accommodation space Sp of the electronic control unit is connected to the outside via the air circulation passages 48A and 48B, internal pressure fluctuations can also be buffered, and, moreover, by increasing the flow velocity of the air flowing through the divided air circulation passage 51 on the accommodation space Sp side of the air circulation passages 48A and 48B, the heat of the heat transfer functional member 52 that is a "cooling object member" can be radiated efficiently.

As mentioned above, in the present embodiment, the air circulation passages connecting the accommodation space of the electronic control unit and the outside to circulate air are provided in order to buffer internal pressure fluctuations, the accommodation space side of the air circulation passages is formed as the divided air circulation passage divided into a plurality of passages, a cooling object member is arranged so as to come in thermal contact with the air flowing through the divided air circulation passage, and the total cross-sectional area of the divided air circulation passage is made smaller than the cross-sectional area of the air circulation passages which have not been divided.

According to this configuration, since the accommodation space of the electronic control unit is connected to the outside by the air circulation passages, internal pressure fluctuations can be buffered, and, moreover, by increasing the flow velocity of the air flowing through the divided air circulation passage on the accommodation space side of the air circulation passages, the heat of the cooling object member can be radiated efficiently to the outside.

In addition, the present invention is not limited to the above embodiments, and various modifications are included. For example, the above embodiments have been explained in detail to facilitate understanding the present invention, and each of them is not always limited to one having all the configurations explained above. In addition, a part of the configuration of one embodiment can be replaced to the configuration of another embodiment. Moreover, the configuration of one embodiment can be also added to the configuration of another embodiment. Furthermore, adding, removing or replacement of another configuration can be possible relative to a part of the configuration of each of the embodiments.

EXPLANATION OF SINGS

6: Electric power steering device
8: Electric motor section
9: Electronic control unit
11: Motor housing
12: Metal cover
13: Connector terminal assembly 14: Output portion
15: End surface portion
15A: Power conversion heat radiation region
16: Power conversion circuit part
17: Power source circuit part
18: Control circuit part
19: End surface portion
20: Coil
21: Stator
22: Rotor
23: Rotation shaft
24: Rotation detection part
25: Through hole
26: Board fixing projection portion
27: Board receiving portion
28: Protruding placement portion
34: Glass epoxy board
38A, 38B: Air circulation passage
39: Waterproof moisture-permeable film
40: Opening region
41: Divided air circulation passage

The invention claimed is:

1. An electric drive device comprising:
a motor housing in which an electric motor for driving a mechanical system control element is accommodated;
an end surface portion of the motor housing which is formed on an opposite side of an output portion of a rotation shaft of the electric motor;
an electronic control unit for driving the electric motor which is accommodated in an accommodation space formed by a cover attached to the end surface portion, and which is disposed adjacent to a side of the end surface portion; and
an air circulation passage connecting the accommodation space of the electronic control unit to an outside of the motor housing so as to circulate air, in order to buffer an internal pressure fluctuation of the accommodation space,
wherein an accommodation space side of the air circulation passage is formed as a divided air circulation passage divided into a plurality of passages, and a cooling object member is disposed so as to come in thermal contact with air flowing through the divided air circulation passage,
wherein a total cross-sectional area of the divided air circulation passage is made smaller than a cross-sectional area of the air circulation passage which has not been divided, and
wherein the air circulation passage is formed inside the end surface portion of the motor housing and a portion of the air circulation passage extends from an outer surface of the end surface portion to inside the end surface portion of the motor housing in a direction along the rotation shaft of the electric motor.

2. The electric drive device according to claim 1, wherein the cooling object member is an electronic component generating heat which composes the electronic control unit.

3. The electric drive device according to claim 2, wherein the electronic component is a power conversion circuit part of the electronic control unit for driving the electric motor, and the power conversion circuit part is packaged with synthetic resin,
wherein the power conversion circuit part is provided so as to be placed in a power conversion heat radiation region formed to the end surface portion of the motor housing, and
wherein the divided air circulation passage is formed in the power conversion heat radiation region in which the power conversion circuit part is placed, such that the air flowing through the divided air circulation passage comes in thermal contact with a placement surface of the power conversion circuit part.

4. The electric drive device according to claim 2, further comprising
an additional air circulation passage,
an additional cooling object member in thermal contact with air flowing through the additional air circulation passage,
wherein the additional electronic component is a microcomputer of a control circuit part for controlling a power conversion circuit part for driving the electric motor, and the microcomputer is packaged with synthetic resin,
wherein an additional divided air circulation passage is formed on a synthetic resin outer surface of the microcomputer, and
wherein the microcomputer comes in tight contact with an inner wall surface of the cover such that the additional divided air circulation passage is connected to the additional air circulation passage formed to the cover, and the air flowing through the additional divided air circulation passage comes in thermal contact with the microcomputer.

5. The electric drive device according to claim 1, wherein the cooling object member is a heat transfer functional member arranged adjacent to a power conversion circuit part composing the electronic control unit which is placed in a power conversion heat radiation region formed to the end surface portion of the motor housing, and the heat transfer functional member is provided so as to be placed in the power conversion heat radiation region, and
wherein the divided air circulation passage is formed in the power conversion heat radiation region in which the heat transfer functional member is placed, and the air flowing through the divided air circulation passage comes in thermal contact with a placement surface of the heat transfer functional member.

6. The electric drive device according to claim 1, wherein a waterproof moisture-permeable film is placed on an opening surface at which the air circulation passage is opened to the outside.

7. An electric drive device comprising:
a motor housing in which an electric motor for driving a mechanical system control element is accommodated;
an end surface portion of the motor housing which is formed on an opposite side of an output portion of a rotation shaft of the electric motor; and
an electronic control unit for driving the electric motor which is accommodated in an accommodation space formed by a metal cover attached to the end surface portion, is disposed adjacent to a side of the end surface portion, and is composed of a control circuit part, a power source circuit part and a power conversion circuit part,
wherein the end surface portion of the motor housing is formed with a power conversion heat radiation region and a power source heat radiation region, and the power conversion circuit part is placed in the power conversion heat radiation region and the power source circuit part is placed in the power source heat radiation region,
wherein an air circulation passage is provided which connects the accommodation space of the electronic control unit to an outside of the motor housing so as to circulate air, in order to buffer an internal pressure fluctuation of the accommodation space, wherein an accommodation space side of the air circulation passage is formed as a divided air circulation passage divided into a plurality of passages, and the divided air circulation passage is formed in the power conversion heat radiation region, wherein the power conversion circuit part is placed in the power conversion heat radiation region so as to come in thermal contact with air flowing through the divided air circulation passage, wherein a total cross-sectional area of the divided air circulation passage is made smaller than a cross-sectional area of the air circulation passage which has not been divided, and wherein the air circulation passage is formed inside the end surface portion of the motor housing and a portion of the air circulation passage extends from an outer surface of the end surface portion to inside the end surface portion of the motor housing in a direction along the rotation shaft of the electric motor.

8. An electric power steering device comprising:
an electric motor for applying steering auxiliary force to a steering shaft based on an output from a torque sensor for detecting a rotation direction and a rotation torque of the steering shaft;
a motor housing in which the electric motor is accommodated;
an end surface portion of the motor housing which is formed on an opposite side of an output portion of a rotation shaft of the electric motor;
an electronic control unit for driving the electric motor which is accommodated in an accommodation space formed by a cover attached to the end surface portion, and which is disposed adjacent to a side of the end surface portion; and
an air circulation passage connecting the accommodation space of the electronic control unit to an outside of the motor housing so as to circulate air, in order to buffer an internal pressure fluctuation of the accommodation space;
wherein an accommodation space side of the air circulation passage is formed as a divided air circulation passage divided into a plurality of passages, and a cooling object member is disposed so as to come in thermal contact with air flowing through the divided air circulation passage,
wherein a total cross-sectional area of the divided air circulation passage is made smaller than a cross-sectional area of the air circulation passage which has not been divided, and
wherein the air circulation passage is formed inside the end surface portion of the motor housing and a portion of the air circulation passage extends from an outer surface of the end surface portion to inside the end surface portion of the motor housing in a direction along the rotation shaft of the electric motor.

9. The electric power steering device according to claim 8, wherein the cooling object member is an electronic component generating heat which composes the electronic control unit.

10. The electric power steering device according to claim 9, wherein the electronic component is a power conversion circuit part of the electronic control unit for driving the electric motor, and the power conversion circuit part is packaged with synthetic resin,
wherein the power conversion circuit part is provided so as to be placed in a power conversion heat radiation region formed to the end surface portion of the motor housing, and
wherein the divided air circulation passage is formed in the power conversion heat radiation region in which the power conversion circuit part is placed, such that the air flowing through the divided air circulation passage comes in thermal contact with a placement surface of the power conversion circuit part.

11. The electric power steering device according to claim 9, wherein the electronic component is a microcomputer of a control circuit part for controlling a power conversion circuit part for driving the electric motor, and the microcomputer is packaged with synthetic resin,
wherein the divided air circulation passage is formed on a synthetic resin outer surface of the microcomputer, and
wherein the microcomputer comes in tight contact with an inner wall surface of the cover such that the divided air circulation passage is connected to the air circulation passage formed to the cover, and the air flowing through the divided air circulation passage comes in thermal contact with the microcomputer.

12. The electric power steering device according to claim 8, wherein the cooling object member is a heat transfer functional member arranged adjacent to a power conversion circuit part composing the electronic control unit which is placed in a power conversion heat radiation region formed to the end surface portion of the motor housing, and the heat transfer functional member is provided so as to be placed in the power conversion heat radiation region, and
wherein the divided air circulation passage is formed in the power conversion heat radiation region in which the heat transfer functional member is placed, and the air flowing through the divided air circulation passage comes in thermal contact with a placement surface of the heat transfer functional member.

13. The electric power steering device according to claim 8, wherein a waterproof moisture-permeable film is placed on an opening surface at which the air circulation passage is opened to the outside.

* * * * *